US007136220B2

(12) United States Patent
Ulrich et al.

(10) Patent No.: US 7,136,220 B2
(45) Date of Patent: Nov. 14, 2006

(54) CATADIOPTRIC REDUCTION LENS

(75) Inventors: Wilhelm Ulrich, Aalen (DE); David R. Shafer, Fairfield, CT (US); Alexander Epple, Aalen (DE); Helmut Beierl, Heidenheim (DE); Aurelian Dodoc, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/805,393

(22) Filed: Mar. 22, 2004

(65) Prior Publication Data

US 2004/0263955 A1     Dec. 30, 2004

Related U.S. Application Data

(63) Continuation of application No. PCT/EP02/10281, filed on Sep. 13, 2002, which is a continuation-in-part of application No. 10/224,485, filed on Aug. 21, 2002.

(60) Provisional application No. 60/331,785, filed on Nov. 21, 2001, provisional application No. 60/331,276, filed on Nov. 13, 2001, provisional application No. 60/331,250, filed on Nov. 13, 2001, provisional application No. 60/323,330, filed on Sep. 20, 2001, provisional application No. 60/313,501, filed on Aug. 21, 2001.

(51) Int. Cl.
 *G02B 17/00*   (2006.01)
 *G02B 21/00*   (2006.01)
 *G02B 23/00*   (2006.01)

(52) U.S. Cl. .................................... 359/364; 359/726

(58) Field of Classification Search ........ 359/366–364, 359/726–731, 857–861
See application file for complete search history.

(56) References Cited

U.S. PATENT DOCUMENTS 4,953,960 A    9/1990  Williamson
5,052,763 A *  10/1991 Singh et al. ................ 359/355

(Continued)

FOREIGN PATENT DOCUMENTS

DE    42 03 464 A1    8/1992

(Continued)

OTHER PUBLICATIONS

Saburo Nonotaki et al.: "Microlithography Fundamentals in Semiconductor Devices and Fabrication Technology;" Marcel Dekker, Inc., New York, 1998.

*Primary Examiner*—Drew A. Dunn
*Assistant Examiner*—Joshua L. Pritchett
(74) *Attorney, Agent, or Firm*—Sughrue Mion, PLLC

(57) ABSTRACT

A catadioptric projection lens for imaging a pattern arranged in an object plane onto an image plane, preferably while creating a real intermediate image, including a catadioptric first lens section having a concave mirror and a physical beamsplitter having a beamsplitting surface, as well as a second lens section that is preferably refractive and follows the beamsplitter, between its object plane and image plane. Positive refractive power is arranged in an optical near-field of the object plane, which is arranged at a working distance from the first optical surface of the projection lens. The beamsplitter lies in the vicinity of low marginal-ray heights, which allows configuring projection lenses that are fully corrected for longitudinal chromatic aberration, while employing small quantities of materials, particularly those materials needed for fabricating their beamsplitters.

54 Claims, 9 Drawing Sheets

U.S. PATENT DOCUMENTS

| | | |
|---|---|---|
| 5,212,593 A | 5/1993 | Williamson et al. |
| 5,402,267 A | 3/1995 | Fuerter et al. |
| 5,537,260 A | 7/1996 | Williamson |
| 5,583,696 A | 12/1996 | Takahashi |
| 5,691,802 A | 11/1997 | Takahashi |
| 5,694,241 A | 12/1997 | Ishiyama et al. |
| 5,742,436 A | 4/1998 | Furter |
| 5,771,125 A | 6/1998 | Ishiyama |
| 5,808,805 A | 9/1998 | Takahashi |
| 5,835,284 A | 11/1998 | Takahashi et al. |
| 5,861,997 A | 1/1999 | Takahashi |
| 5,969,882 A | 10/1999 | Takahashi |
| 5,999,333 A | 12/1999 | Takahashi |
| 6,081,382 A | 6/2000 | Omura |
| 6,101,047 A | 8/2000 | Chung et al. |
| 6,108,140 A | 8/2000 | Hashimoto et al. |
| 6,118,596 A | 9/2000 | Hashimoto et al. |
| 6,208,473 B1 * | 3/2001 | Omura ................. 359/727 |
| 6,377,388 B1 | 4/2002 | Sakata et al. |
| 6,624,880 B1 * | 9/2003 | Sandstrom et al. ........... 355/71 |
| 6,707,532 B1 * | 3/2004 | Suzuki ................. 355/52 |
| 6,717,746 B1 * | 4/2004 | Epple et al. ............. 359/727 |

FOREIGN PATENT DOCUMENTS

| | | |
|---|---|---|
| EP | 0 350 955 A2 | 1/1990 |
| EP | 0 475 020 A2 | 3/1992 |
| EP | 0 602 923 A1 | 6/1994 |
| EP | 0 902 329 A1 | 3/1999 |
| EP | 0 989 434 A2 | 3/2000 |
| EP | 1 102 100 A2 | 5/2001 |

* cited by examiner

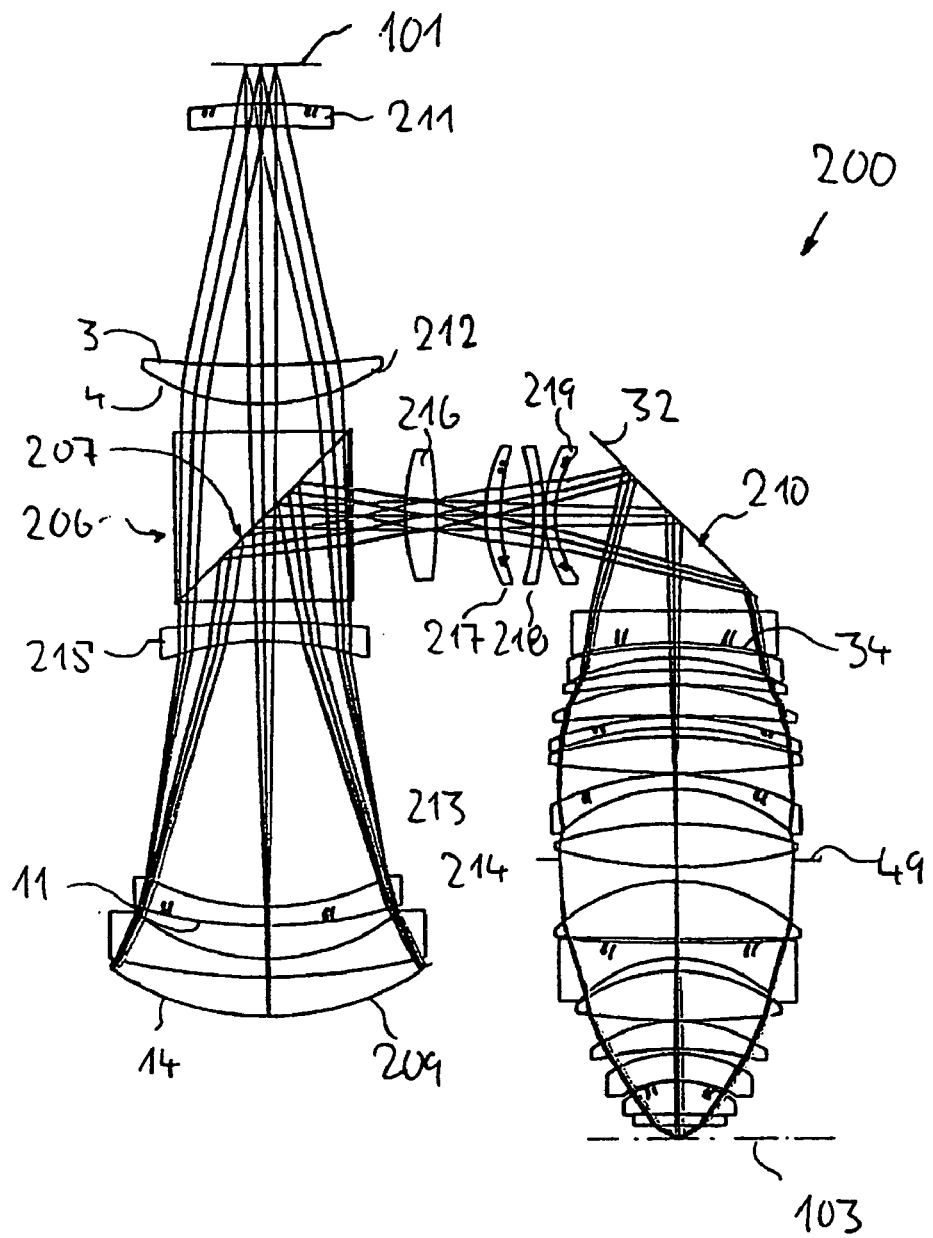

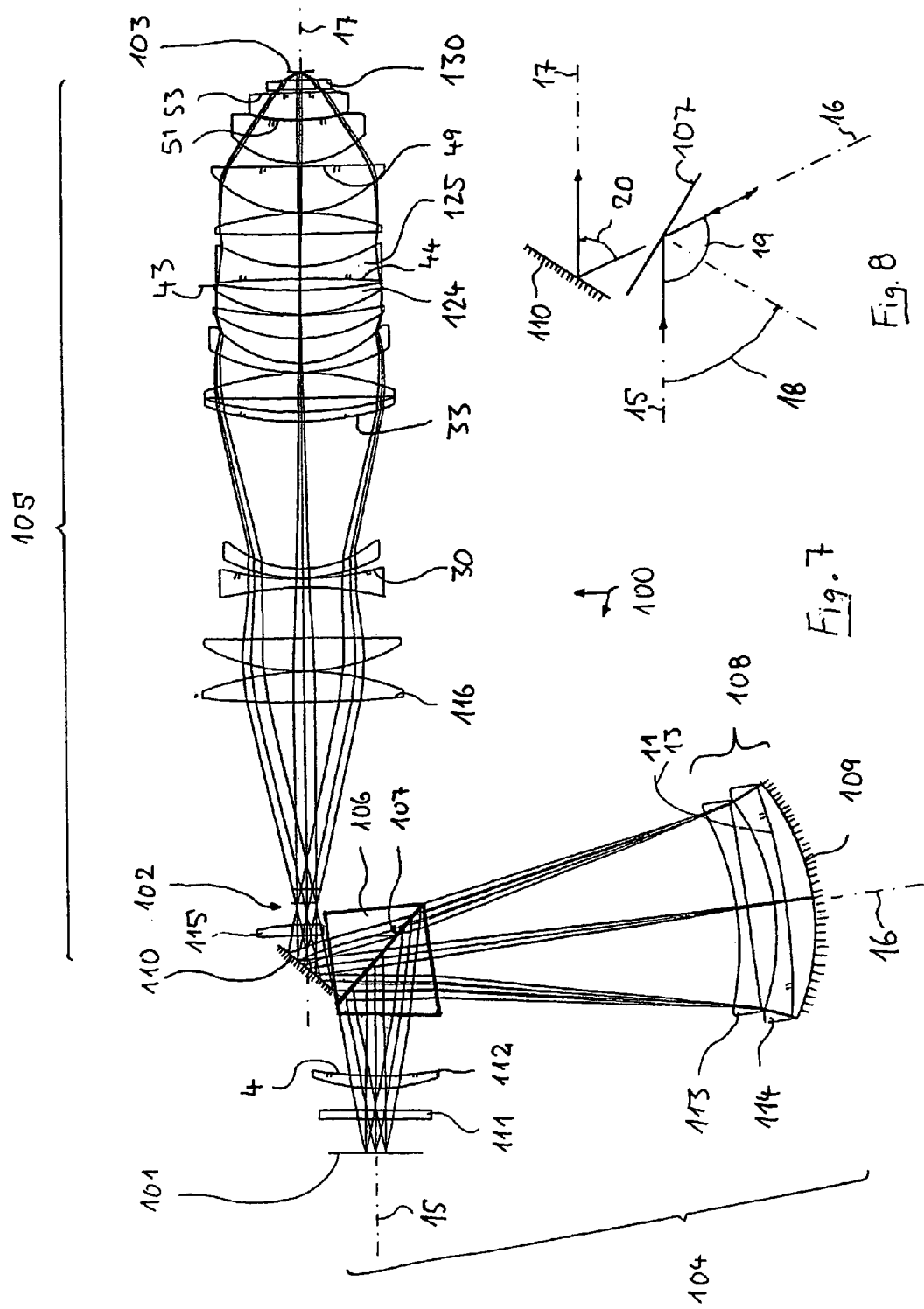

CATADIOPTRIC REDUCTION LENS

This is a Continuation of International Application PCT/EP02/10281, with an international filing date of Sep. 13, 2002, which was published under PCT Article 21(2) in English, and the complete disclosure of which is incorporated into this application by reference; in addition, the present application is a Continuation-in-Part of U.S. application Ser. No. 10/224,485, filed on Aug. 21, 2002; further, the present application claims priority to the following:

U.S. Provisional Patent Application 60/323,330, filed Sep. 20, 2001;
U.S. Provisional Patent Application 60/331,250, filed Nov. 13, 2001;
U.S. Provisional Patent Application 60/331,276, filed Nov. 13, 2001;
U.S. Provisional Patent Application 60/313,501, filed Aug. 21, 2001; and
U.S. Provisional Patent Application 60/331,785, filed Nov. 21, 2001.

FIELD OF AND BACKGROUND OF THE INVENTION

The invention relates to a catadioptric projection lens for imaging a pattern arranged in an object plane onto an image plane.

Projection lenses of that type are employed on projection exposure systems, in particular wafer scanners or wafer steppers, used for fabricating semiconductor devices and other types of microdevices and serve to project patterns on photomasks or reticles, hereinafter referred to as "masks" or "reticles," onto an object having a photosensitive coating with ultrahigh resolution on a reduced scale.

In order create even finer structures, it is desired to both increase the image-end numerical aperture (NA) of the projection lens and to employ shorter wavelengths, preferably ultraviolet light with wavelengths less than about 260 nm.

However, there are very few materials, in particular, synthetic quartz glass and crystalline fluorides, such as calcium fluoride, barium fluoride, magnesium fluoride, lithium-calcium-aluminum fluoride, lithium-strontium-aluminum fluoride, lithium fluoride, and similar, that are sufficiently transparent in that wavelength region available for fabricating the optical elements required. Since the Abbé numbers of those materials that are available lie rather close to one another, it is difficult to provide purely refractive systems that are sufficiently well color-corrected (corrected for chromatic aberrations). Although this problem might well be solved by employing purely reflective systems, fabricating such mirror systems involves substantial expense and effort.

In view of the aforementioned problems, catadioptric systems that combine refracting and reflecting elements, in particular, lenses and mirrors, are usually employed for configuring high-resolution projection lenses of the aforementioned type.

Whenever imaging reflective surfaces are involved, it is beneficial to employ beam-deflecting devices if images free of obscurations and vignetting are to be achieved. Both systems having geometric beamsplitters and systems having physical beamsplitters are known. A system having geometric beamsplitting achieved with the aid of a pair of beam-deflecting mirrors is disclosed in European Patent EP 0 989 434, which corresponds to U.S. Ser. No. 09/364,382. Whereas systems having geometric beamsplitting have the disadvantage that they are necessarily off-axis systems due to the geometric beamsplitting, employing a physical beamsplitter will allow configuring on-axis systems.

A system having a physical beamsplitter is known from European Patent EP-A-0 475 020, which corresponds to U.S. Pat. No. 5,052,763. That system has at least one catadioptric entrance system and a dioptric exit system. The mask to be imaged lies directly on a beamsplitter that is configured in the form of a beamsplitter cube (BSC) and deflects part of the light reflected by the catadioptric system to the dioptric system. However, arranging the object to be imaged directly on the beamsplitter limits opportunities for correcting the entire system. Moreover, the object end of this system is nontelecentric.

Another catadioptric system having a physical beamsplitter and an intermediate image is known from U.S. Pat. No. 5,694,241, where a lens group having a positive refractive power is arranged between the object plane and the beamsplitter, which is remote from the object plane.

A catadioptric projection lens that has no intermediate image wherein a first lens group is provided between the object plane and a physical beamsplitter, a second lens group is provided between the physical beamsplitter and a concave mirror, and a third lens group is provided between the physical beamsplitter and the image plane is known from European Patent Application EP-A-0 350 955, which corresponds to U.S. patent application U.S. Pat. No. 4,953,960. The lens group arranged between the beamsplitter and the concave mirror are intended to correct for low-order coma and spherical aberrations of the concave mirror, as well as Gaussian errors, where a low negative refractive power will be sufficient to compensate for longitudinal chromatic aberration of the refractive groups.

A catadioptric projection lens that has a physical beamsplitter and no intermediate image and allows image-end high numerical apertures of at least 0.5, combined with a beneficial design and low sensitivity to alignment errors is Known from German Patent Application DE-A-42 03 464, which corresponds to U.S. patent application U.S. Pat. No. 5,402,267. This system is largely characterized by the fact that no lens group is arranged between the concave mirror and beamsplitter, and that the concave mirror has a strong reduction effect, i.e., a strong image demagnification. Longitudinal chromatic aberration (CHL) is primarily corrected by employing a highly convergent beam in the beamsplitter cube and may result in full achromatization of longitudinal chromatic aberration. The beam ahead of the concave mirror, i.e., that undergoing its first pass of the beamsplitter, is nearly, or substantially, collimated, while the beam following the concave mirror, i.e., that undergoing its second pass of the beamsplitter, is normally highly convergent. The system stop is preferably situated at the concave mirror and defined by its perimeter. This stop may also be defined on the surface of the beamsplitter facing the concave mirror or by inserting a stop between the concave mirror and the beamsplitter. Other benefits provided by the highly convergent beam following reflection at the concave mirror are that only a slight amount of refractive power must be provided following the beamsplitter and that relatively small beam heights occur in that vicinity, which means that adverse effects on chromatic aberration due to large beam heights in that vicinity are avoided.

The benefits provided by lenses of that type are counteracted by a disadvantage, namely that the beam incident on the beamsplitting surface is convergent, particularly on the second pass, following reflection at the concave mirror, which means that the range of incidence angles occurring at its surface is very broad, which imposes stringent demands on the quality of its beamsplitting coating. The sharp convergence of the beam following reflection at the concave mirror causes also means that very little space is available for lenses following the beamsplitter and thus that few means for correcting for aberrations remain available. Further increasing image-end numerical aperture would both necessitate employing a larger beamsplitter cube and shift the image plane closer to the beamsplitter. Such projection lenses are thus also regarded as "aperture-limited." Another of their disadvantages is that they require employing relatively large beamsplitters, which are expensive, due to the limited availability of materials suitable for their fabrication.

Fundamentally similar problems also arise in the case of projection lenses that are configured in fashions similar to, and have beam paths similar to, that depicted in German Patent Application DE-A-42 03 464. Included thereunder are, for example, those projection lenses depicted in U.S. patent applications U.S. Pat. No. 6,118,596, U.S. Pat. No. 6,108,140, and U.S. Pat. No. 6,101,047. Large incidence angles on beamsplitting surfaces may also occur in the case of systems, such as those depicted in U.S. Patents U.S. Pat. No. 5,808,805, U.S. Pat. No. 5,999,333, or U.S. Pat. No. 5,861,997, where an intermediate image is created in the vicinity of their beamsplitting surface.

A catadioptric projection lens that has a physical beamsplitter and no intermediate image, wherein the beam is slightly divergent on its first pass of the beamsplitting coating and is collimated on its second pass of that coating, i.e., following reflection at the concave mirror, which is intended to allow avoiding deteriorations in image quality due to the dependence of the reflectance of the beamsplitting coating on angle of incidence, is known from U.S. patent application U.S. Pat. No. 5,771,125. The light reflected by that coating is collimated by keeping the refractive power of the lens group that includes the concave mirror relatively low. However, in the case of the system depicted in European Patent Application EP-A-0 602 923, which corresponds to U.S. patent application U.S. Pat. No. 5,715,084, a positive lens is arranged ahead of the physical beamsplitter in order to collimate the beam incident on the beamsplitting coating on its first pass of that coating. The beam is convergent following reflection at the concave mirror. Such systems require use of large beamsplitters.

In the case of a catadioptric projection system having a physical beamsplitter and no intermediate image, German Patent Application DE-A-44 17 489, which corresponds to U.S. patent application U.S. Pat. No. 5,742,436, proposes arranging at least one condenser lens, i.e. a lens with postive refractive power for collimating the beam incident on the beamsplitting coating on its object end, ahead of the physical beamsplitter, in order to minimize the incidence angles on the beamsplitting coating, and a scattering lens group having a negative lens following the physical beamsplitter in its catadioptric lens section, i.e., between the beamsplitter and the concave mirror, in order to compensate for the effect of the condenser lens ahead of the beamsplitter and correct for longitudinal chromatic aberration. Under this design, the beam is substantially collimated for both directions of propagation through the beamsplitter cube. The system stop normally follows the beamsplitter cube in the optical train. Since the beam is substantially collimated for both directions of propagation through the beamsplitter cube, problems that arise for broad ranges of incidence angles thereon are avoided. Another benefit of this collimated beam on the second pass, following reflection at the concave mirror, is that sufficient space remains available on the image side of the beamsplitter for incorporating means for correcting for aberrations. The disadvantage of the arrangement in accordance with German Patent Application DE-A-44 17 489 is that its overcorrected catadioptric lens section is incapable of fully correcting for longitudinal chromatic aberration (CHL). That arrangement also requires employment of relatively large beamsplitters, which is a disadvantage due to the limited availability of materials suitable for their fabrication.

European Patent EP 1 102 100, which corresponds to U.S. Ser. No. 09/711,256, describes a catadioptric reduction lens that differs from the design depicted in German Patent DE 44 17 489 in that, among other things, it allows fully correcting for longitudinal chromatic aberration. That system has a first lens section having a positive refractive power, a physical beamsplitter having a beamsplitting surface, a second lens section that is arranged between the physical beamsplitter and a concave lens, and a third lens section that is arranged between the beamsplitter and its image plane, between its object plane and its image plane, in that order. At least two lenses having negative refractive powers re arranged within its second lens section. That concentration of high negative refractive power, in particular, in the vicinity of the concave mirror, benefits fully correcting for longitudinal chromatic aberration and allows configuring systems that have working distances, both between their object plane and their first lens section and between their third lens section and their image plane, that are sufficiently large to allow their employment in microlithographic applications Such systems also allow providing a largely collimated beam in the vicinity of their beamsplitting surface for both directions of propagation through their beamsplitting surface in order that the angles incidence on their beamsplitting surface will be confined to a narrow range, which will allow largely avoiding the aforementioned disadvantages of widely varying angles of incidence. That patent describes embodiments having an intermediate image, combined with numerical apertures, NA, ranging up to about NA=0.7. The disadvantage involved there is that relatively large quantities of materials that, in suitable qualities, are in short supply, are required for fabricating their beamsplitters.

Among other things, U.S. Pat. No. 6,377,338 B1 describes systems having physical beamsplitters fabricated from crystalline fluoride materials.

In the case of the aforementioned systems having physical beamsplitters, their respective beamsplitting surfaces are inclined at an angle of 45° with respect to a segment of their optical axis orthogonal to their image plane. Any deflecting or folding mirrors that may be present, in particular, in their second lens section, are also inclined at an angle of 45° with respect to their optical axis in order to fold their optical axis through a right angle, which allows achieving an orthogonal or parallel arrangement of their object plane and image plane, whichever may be preferred, where the latter arrangement is particularly beneficial for scanner operation.

OBJECTS OF THE INVENTION

One of the problems addressed by the invention is providing a catadioptric projection lens having a physical beamsplitter that avoids the disadvantages of the state of the art. In particular, it should allow full achromatization, combined with a very high image-end numerical aperture and a beneficial design. This object should be achieved by using low quantities of materials, particularly for fabricating the beamsplitter and components situated in the vicinity its beamsplitter. A beneficial design, particularly in the vicinity of the object plane is preferably to be obtained.

SUMMARY OF THE INVENTION

As a solution to these and other objects, the invention proposes a catadioptric projection lens for imaging a pattern situated in an object plane onto an image plane, including: an optical axis; a first catadioptric lens section having a concave mirror and a physical beamsplitter having a beamsplitting surface; and a second lens section arranged following the beamsplitter. The first and second lens sections are arranged between the object plane and the image plane. The wording of all claims is incorporated into the contents of this description by reference.

A catadioptric projection lens, in accordance with one formulation of the invention, is configured for imaging a pattern arranged in an object plane onto an image plane and has a catadioptric first lens section comprising a concave mirror and a physical beamsplitter having a beamsplitting coating between the object plane and image plane. A second lens section that is preferably designed to be dioptric is arranged following the beamsplitter.

According to one aspect of the invention, the object plane is arranged at a working distance from a first optical surface of the projection lens. Positive refractive power is arranged within the optical near-field of the object plane. The beamsplitter is arranged within a zone where marginal-ray heights are low. At least one real intermediate image is preferably created.

The unobstructed (free) working distance formed between the object plane, or reticle plane, and the first optical component of the projection lens, which should preferably exceed 30 mm, in particular, may, even exceed 35 mm, allows handling the reticle without running the risk of damaging the projection lens, as well as gas-assisted cleansing, or maintaining the cleanliness of, the reticle area and the entrance surface of the projection lens in a simple manner.

The positive refractive power present in the optical near-field of the object plane allows a telecentric configuration of the object end of the projection lens, which is beneficial, particularly in relation to defocusing errors. Defined as "optical near-field of the object plane" here is, in particular, a zone where beam marginal-ray heights are less than about 30% of the marginal-ray height in the vicinity of the concave mirror.

Arranging the beamsplitter in the vicinity of low marginal-ray heights allows constructing projection lenses in accordance with the invention that have beamsplitters that are very small compared to the state of the art. This is particularly useful in the case of projection lenses intended for use at operating wavelengths less than about 260 nm, in particular, at operating wavelengths of 193 nm or 157 nm or below. The transparent materials, in particular, fluoride crystal, such as calcium fluoride, magnesium fluoride, lithium-calcium-aluminum fluoride, lithium-strontium-aluminum fluoride, lithium fluoride, or barium fluoride, available for fabricating optical components for use within this range of operating wavelengths either cannot be fabricated in large, solid, blocks with the required high degrees of purity and homogeneity, or can be fabricated in such blocks with difficulty only, employing currently available technologies, which means that implementing optical designs that employ those materials is, in practice, limited by the availabilities of sufficiently large chunks of material. This particularly applies to the materials employed for fabricating physical beamsplitters, which are frequently configured in the form of beamsplitter cubes (BSC) or other solid blocks of material. A design that may be implemented employing small beamsplitters is thus of great practical use.

A favorable region or zone of low marginal-ray heights for arranging the beamsplitter is preferably characterized by a projection of the marginal-ray heights of the beam onto a plane orthogonal to the optical axis that intersects the optical axis at the point where the beamsplitting surface intersects the optical axis that ranges from about 20% to about 70% of the marginal-ray heights at the concave mirror. The dimensions of the beamsplitter along directions orthogonal to the optical axis may thus be held to less than 70%, or even less than 50%, of the diameter of the concave mirror.

It may be particularly beneficial if the beamsplitter is arranged in the vicinity of an intermediate image, where low ray heights occur. The beamsplitter should preferably lie closer to an intermediate image than to the object plane. It can be beneficial if that intermediate image lies outside the beamsplitter in order to avoid overheating of the beamsplitter material due to high radiant-energy densities. In this manner, a beamsplitter may be arranged within a region where marginal-ray heights are low, where the marginal-ray heights therein should preferably be less than about 70% of the marginal-ray height at the concave mirror for both transits of the beamsplitter.

According to another aspect of the invention, the beamsplitting surface is arranged at an inclination angle with respect to a segment of the optical axis running orthogonal to the object plane that differs from 45°, where the difference between that inclination angle and 45° should preferably greatly exceed the maximum differences that will occur anyhow due to fabrication tolerances. In particular, the absolute value of the difference between that inclination angle and 45° might range from about 1° to about 10°. The angle through which the optical axis is folded at a beamsplitting surface inclined at such an angle may thus substantially differ from a right angle, which will provide new degrees of freedom in designing the mentioned types of projection lenses, particularly in the vicinity of their object plane, where a reticle stage for holding, and, if necessary, translating, a mask arranged in the object plane must be accommodated. Inclining the beamsplitting surface in that manner may also allow shifting the range of incidence angles on the beamsplitting surface to a range for which readily fabricated, optically effective, beamsplitter coatings are available.

This particular inclined orientation of the beamsplitting surface may be beneficial in the case of all projection lenses having beamsplitters, for example, systems having, or lacking, intermediate images, systems having, or lacking, working distances on their object ends, and/or systems having refractive-power distributions other than those explicitly described in this patent application, regardless of the other characteristics of the invention.

That inclination angle should preferably be set such that an included deflection angle between a segment of the optical axis orthogonal to the object plane and a segment of the optical axis extending from the beamsplitting surface to the second lens section exceeds 90°, where that angle may, in particular, range from about 92° to about 110°. This allows moving the physical beamsplitter fairly close to the object plane and keeping it relatively small, and, at the same time, to avoid that a side arm of the lens supporting the concave mirror would physically intrude into the space for accommodating a device for manipulating the mask.

Projection lenses in accordance with the invention may be designed to have various foldings of their beam paths, where it may be provided that at least one deflecting mirror that may lie ahead of, or following, the first transparent optical component of the second lens section is allocated to their second lens section. In the case of beamsplitting surfaces that are tilted through an angle differing from 45°, that deflecting mirror should preferably be inclined at an inclination angle with respect to the optical axis that differs from 45°, where both inclination angles exceeding 45°, for examples, inclination angles ranging from 46° to 55°, and inclination angles less than 45°, for example, inclination angles ranging from 35° to 44°, are feasible. It will be particularly beneficial if the inclination angle of that deflecting mirror is adjusted to suit the inclination angle of the beamsplitting surface such that the image plane is parallel to, or orthogonal to, the object plane, where the parallel arrangement is preferred for scanner operation.

At least one lens, or other type of optical component, may be arranged between the beamsplitting surface and a deflecting mirror allocated to the second lens section. The space between the beamsplitting surface and a deflecting mirror that follows it in the optical train may also be kept free of optical components, which will allow moving the deflecting mirror very close to the beamsplitting surface, which may be utilized for minimizing a transverse offset of the object field relative to the image field. Moreover, on many projection lenses, that segment of their optical axis that follows the beamsplitting surface is tilted, i.e., is neither vertical nor horizontal. Lenses mounted anywhere along that segment thus must also be tilted, i.e., must be mounted with their lens axes tilted. Avoiding such tilted lenses both facilitates designing their mountings and simplifies the alignment of such projection lenses.

Some types of projection lenses of this invention are characterized by the fact that they image a pattern arranged in their object plane onto their image plane while creating at least one, real, intermediate image, where preferably at least one, real, intermediate image is thereby created. Projection lenses that have at least one intermediate image also have at least one additional field plane in addition to their object plane and image plane and at least one conjugate aperture plane in addition to their system stop, which means that numerous degrees of freedom for correcting for imaging errors, for example, incorporating corrective aspherical surfaces on their optical components, are available. That intermediate image is preferably freely accessible in order that, for example, a field stop, may be incorporated in the vicinity thereof. Since, in the case of freely accessible intermediate images, no optical material is present in their associated intermediate-image planes, materials problems due to high radiant-energy densities are also largely precluded.

In the case of many embodiments, their intermediate image lies at a location within their dioptric second lens section such that at least one lens, in particular, at least one positive lens, of their second lens section is arranged between the beamsplitting surface and their intermediate image. This may have a beneficial effect on the correction status of their intermediate image.

According to another aspect of the invention, the object plane is arranged at a working distance from a first optical surface of the projection lens. The space between the object plane and the beamsplitter is substantially free of positive refractive power. The projection lens creates at least one intermediate image. Positive refractive power is arranged within an optical near-field of the object plane and/or the intermediate image, and the beamsplitter is arranged within a region where marginal-ray heights are low.

The benefits and beneficial dimensions of a freely accessible working area have been mentioned above. Incorporating positive refractive power within an optical near-field of their object plane allows a telecentric configuration of the object ends of projection lenses, which is beneficial, particularly in relation to correcting for defocusing errors. Incorporating positive refractive power within the near-field of their intermediate image supports arriving at low marginal-ray heights in the vicinity of a beamsplitter arranged in the vicinity of their intermediate image.

Embodiments whose object ends are nontelecentric, are also feasible. This, for example, allows adapting them to suit illumination systems whose exit ends are nontelecentric. This, in turn, allows varying the magnification of the image of a mask situated in the vicinity of their object plane by making minimal axial adjustments.

Since no positive refractive power need be provided within the space between the object plane and the beamsplitter, projection lenses having no isolated lenses arranged between their object plane and beamsplitter are feasible, which will allow keeping the designs of that particular section highly compact and arranging a beamsplitter having a small volume near the object plane, where marginal-ray heights are low. Positive refractive power may, for example, be provided within the space between the beamsplitter and the concave mirror, preferably within the optical near-field of the object plane, in particular, where the marginal-ray heights at the at least one positive lens are less than about 30% of the marginal-ray heights at the concave mirror, which supports attaining object-end telecentricity. Merely a single positive lens should preferably be provided therein.

As an alternative thereto, or in addition thereto, positive refractive power may be arranged following the beamsplitter, within that region where marginal-ray heights are low. Herein marginal-ray heights may also be less than about 30% of the marginal-ray heights at the concave mirror. In the case of embodiments whose intermediate image is arranged sufficiently far behind their beamsplitter, positive refractive power, preferably in the form of a single positive lens, may be arranged between their beamsplitter and their intermediate image.

In the case of an embodiment, no positive lenses are arranged within either the space between the object plane and the beamsplitter or the space between the beamsplitter and the concave mirror. This allows employing a simple design for its catadioptric lens section, which may be configured without employing any positive lenses.

The imaging capabilities of projection lenses of the type mentioned here are largely dependent upon a mastery of the polarization characteristics of their optical components, i.e., their light source, the optical materials employed for their fabrication, the thin films of their coatings, and their numerical aperture. The calcium-fluoride crystals that have meanwhile become available have, in addition to their better homogeneities and better transmittances, more useful stress-birefringence coefficients (SBC) ranging down to less than 1 nm/cm. The values of their stress-birefringence coefficients at short wavelengths, e.g., 157 nm, should not exceed that value by much in order that the qualities of the resultant images will not be limited thereby. Regarding stress birefringence, it will also be beneficial if the volumes of beamsplitter blocks are kept as small as possible in order that disturbing contributions due to intrinsic birefringence will remain within tolerable limits. Several versions of projection lenses according to the invention are optimized in that respect. For example, it may be beneficial if no refractive components, such as spherical or aspherical lenses, are arranged between their object plane, or reticle, and their beamsplitter in order to allow maintaining a minimum distance between their object plane and their beamsplitter. Any plane-parallel λ/4 plate arranged therein that may be required can have a negligible thickness, and may, for example, be optically contacted onto the entrance face of the beamsplitter. The proximity to the object plane supports small beamsplitter volumes. It may also be beneficial if the illumination system does not supply telecentric light but instead, its principal rays converge from the edges of the image field to the center of the beamsplitter, as in the case of, e.g., a homocentric entrance aperture. This allows both shortening the lengths of the prismatic edges of a beamsplitter block and reducing the axial offset of the centers of the object plane and image plane.

Particularly in conjunction with the aforementioned measures, it may be beneficial if the material employed for fabricating the beamsplitter is lithium fluoride, or, if necessary, a mixed, lithium-fluoride-based, crystal. In addition to their high transmittance, the benefits of employing lithium fluoride, or similar materials, are that their absorption edges for UV light occur at shorter wavelengths than for, for example, calcium fluoride. Since their intrinsic-birefringence coefficients are about half that of, for example, calcium fluoride, the polarization characteristics of the entire optical system will be improved. Although each of the aforementioned measures are useful when employed alone, combining all of them allows, for example, reducing the contributions of intrinsic birefringence to about ⅓ of that of known designs that employ calcium fluoride.

The benefits of arranging the beamsplitter within a region where marginal-ray heights are low and the preferred, low, marginal-ray heights have been stated above. It will be particularly beneficial if the beamsplitter is arranged in the vicinity of an intermediate image, where low marginal-ray heights occur. The beamsplitter should preferably lie roughly halfway between the object plane and the intermediate image, but may be moved closer to the object plane, if necessary. It may be beneficial if the intermediate image lies outside the beamsplitter in order to avoid overheating of the beamsplitter material due to high radiant-energy densities. It may be provided to arrange a beamsplitter within a region where marginal-ray heights are low, where the marginal-ray heights therein should preferably be less than about 70% of the marginal-ray heights at the concave mirror for both transits of the beamsplitter.

Regardless of design features in the vicinity of the beamsplitter, arranging a strong, negative, refractive power within the catadioptric lens section, between the beamsplitter and the concave mirror, has been found to be beneficial. This may be accomplished by arranging one or more negative lenses in that region, where it is preferable if at least two negative lenses are provided. In the case of many sample embodiments, concentrating a strong, negative, refractive power in that region is possible by providing exclusively lenses having a negative refractive power, i.e., no positive lenses, between the beamsplitter and the concave mirror lens. Doing so will allow minimizing the number of lenses employed in that region. Less than four lenses, in particular, less than three lenses, may be provided in order to allow conserving lens materials and simplify fabrication of the projection lens.

In some embodiments it is provided that no lenses having positive refractive powers are arranged in the vicinity of the concave lens, where the marginal-ray heights within that vicinity are preferably less than 70% of the marginal-ray heights at the concave lens. This will allow a more "lax" design of the negative lenses providing the negative refractive power for that region, since they will not have to also correct for an undercorrection that would be introduced by a positive lens.

The strength of the negative refractive power concentrated between the beamsplitter and concave mirror, which acts during both passes of the beamsplitter, should preferably be chosen to suit the refractive powers of the other lens sections such that the lens section situated between the beamsplitter and the concave mirror is overcorrected for longitudinal chromatic aberration such that a chromatic undercorrection by other lens sections is substantially compensated. Compensations of at least 70%, preferably even in excess of 85%, are feasible in the case of several embodiments.

The positive refractive power within the optical near-field of the object plane may be provided in various manners. Positive refractive power may be provided between the object plane and the beamsplitter by, for example, arranging a positive lens that, due to its proximity to the object plane, may have a small diameter, within that region. At most one positive lens is frequently provided within that region. Arranging positive refractive power ahead of the entrance face of the beamsplitter may be utilized for reducing the divergence of radiation coming from object plane to the extent where a well-collimated beam results in order that variations in the angle of incidence of incident radiation will be relatively small in the vicinity of the beamsplitting surface. In the case of preferred embodiments, that radiation may, for at least one direction of propagation through the beamsplitting surface, be collimated to the point where the angle between marginal rays and the optical axis at the beamsplitting surface is less than about 8°, preferably less than 5°, for at least one direction of propagation through the beamsplitting surface.

In some embodiments no isolated lenses are arranged between the object plane and the beamsplitter. This allows keeping the designs in that particular section highly compact and arranging a beamsplitter close to their object plane, where marginal-ray heights are low. Positive refractive power may then be arranged within the space between the beamsplitter and the concave mirror, to be more specific, within the optical near-field of the object plane, in particular, at a location where the marginal-ray heights at the at least one positive lens are less than about 30% of the marginal-ray heights at the concave mirror. Here preferably just one positive lens is provided.

Alternatively, or in addition, positive refractive power may be arranged in the vicinity of the intermediate image, where marginal-ray heights are low. Within that vicinity, marginal-ray heights may also be less than about 30% of the marginal-ray heights at their concave mirror. In the case of embodiments whose intermediate image is arranged at a sufficiently large distance behind the beamsplitter, positive refractive power, preferably in the form of a single positive lens, may be arranged between their beamsplitter and their intermediate image.

In some embodiments, one or more aspherical surfaces are provided in order to arrive at a good monochromatic correction, or high imaging accuracy, combined with low aberrations, at very large numerical apertures, while keeping utilizations of materials low. Although a large number of aspherical surfaces are usually provided, no more than eight should preferably be provided. It may be beneficial if at least three aspherical surfaces are arranged within the second lens section, following the beamsplitter. It may be particularly useful if, in view of the need to correct for spherical aberration and coma, at least one aspherical surface is arranged in the vicinity of the plane of a stop. In this case a particularly effective correction will be obtained if the ratio of the marginal-ray height at that surface to the radius of the opening in the stop ranges from about 0.8 to about 1.2, i.e., the marginal-ray heights at the aspherical surface should nearly equal the maximum marginal-ray heights occurring in the vicinity of the stop.

In order to allow effectively correcting for distortion and other field aberrations, it will be beneficial to provide at least one aspherical surface in the vicinity of a field zone. In the case of a design having an intermediate image, points in the vicinity of a field zone lie in the vicinity of the object plane, in the vicinity of the image plane, and in the vicinity of the at least one intermediate image. These field surfaces located near to a field plane are preferably characterized by the fact that the ratio of the marginal-ray height thereon to the radius of their associated system stop is less than about 0.8, and is preferably less than 0.6.

It is beneficial if at least one aspherical surface is arranged in the vicinity of a field plane and at least one aspherical surface is arranged in the vicinity of a system stop, which will allow adequately correcting for all of the aforementioned imaging errors.

Embodiments having at least one intermediate image also have at least one other field plane in addition to their object plane and image plane, as well as at least one conjugate stop plane in addition to their system stop, which means that additional degrees of freedom for incorporating effective aspherical surfaces exist.

In the case of several embodiments, a beneficial configuration, in particular, a reduction of the overall length of the projection lens, is facilitated by providing one or more deflecting mirrors. Preferred is arranging a deflecting mirror following the physical beamsplitter in the second lens section. Incorporating a deflecting mirror allows orienting reticles (situated in the object plane) and wafers (situated in the image plane) parallel to one another, which is particularly favorable for scanner operation. Many embodiments have no lens between their physical beamsplitter and a deflecting mirror that follows it in the optical train in order that the deflecting mirror may be brought up close to the beamsplitter in order to allow compactly designing that part of the lens. This also reduces the number of lenses to be mounted vertically (mounted in an upright position) which, in the case of preferred embodiments, is less than four, and, in particular, may also be less than three.

BRIEF DESCRIPTION OF THE DRAWINGS

The foregoing and other features will be evident from both the claims and the description and figures, where each of the individual features involved may be implemented either alone, or in the form of combinations of subsets thereof, in an embodiment of the invention or in other fields, as well as embodiments that may themselves be patentable. Embodiments of the invention will now be described in connection with the figures, in which:

FIG. 6 is a sectioned view of the lenses of a sixth embodiment of the invention;

FIG. 7 is a sectioned view of the lenses of a seventh embodiment of the invention;

FIG. 8 is a schematic detailed view of vicinity of the beam deflector depicted in FIG. 7, where the angles involved have not been drawn to scale;

DETAILED DESCRIPTION OF THE PREFERRED EMBODIMENTS

In the following description of preferred embodiments of the invention, the term "optical axis" refers to a straight line or a sequence of straight-line segments passing through the centers of curvature of the optical elements involved, where the optical axis will be folded by deflecting mirrors or other reflecting surfaces. Directions and distances shall be designated as "image-end" directions or distances if they are directed toward either the image plane or toward a substrate to be illuminated that is situated therein, and as "object-end" directions or distances if they are directed along that segment of the optical axis that extends toward the object. In the case of the examples presented here, the object may be a mask (reticle) bearing the pattern of an integrated circuit or some other pattern, for example, a grating. In the case of examples presented here, the image of the object is projected onto a wafer coated with a layer of photoresist that serves as a substrate, although other types of substrate, such as components of liquid-crystal displays or substrates for optical gratings, are also feasible.

In the following, identical or corresponding features of the various embodiments will usually be assigned the same reference numbers for greater clarity in all cases. The numbering of the surfaces of the various embodiments corresponds to the surface numbers appearing in the associated tables.

Figure 1:
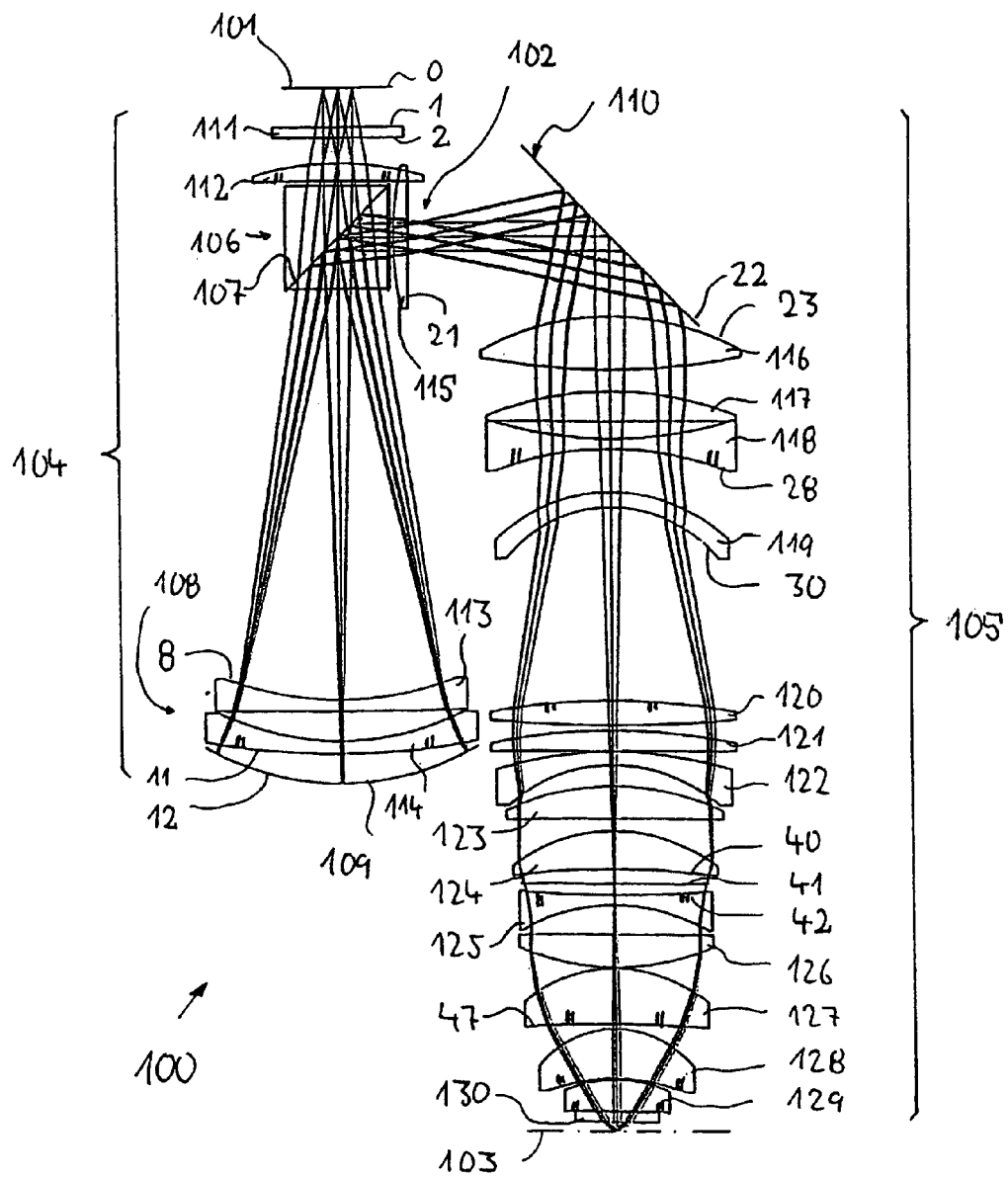
FIG. 1 is a sectioned view of the lenses of a first embodiment of the invention.

A design for a catadioptric reduction lens 100 according to the invention is depicted in FIG. 1, based on a first embodiment thereof, and serves to project an image of a pattern on a reticle or similar arranged in an object plane 101 onto an image plane 103 on a reduced scale, for example, a scale of 4:1, while creating precisely one, real, intermediate image 102. The lens 100 has a catadioptric first lens section 104 that is followed by a purely dioptric second lens section 105 arranged between the object plane and image plane. That catadioptric lens section 104 comprises a physical beamsplitter 106 having a planar beamsplitting surface 107 that is inclined with respect to the optical axis and a mirror group 108 that includes an imaging concave mirror 109.

The reducing second lens section 105 has a planar deflecting mirror 110 inclined at an angle of 45° with respect to the optical axis that, in combination with the reflection at the beamsplitting surface 107, allows orienting a mask arranged in the object plane 101 parallel to a wafer arranged in the image plane 103, which will simplify operating the mask and wafer in scanning mode, following the intermediate image 102. Instead of this angled layout, the second lens section may have either a linear layout lacking a deflecting mirror or be based on a version thereof having more than one deflecting mirror.

As may be seen from FIG. 1, light from an illumination system (not shown) enters the projection lens from that side of the object plane 101 that faces away from the image plane, in the course of which it passes through the mask arranged in the object plane, which is arranged at an object-end working distance exceeding 30 mm ahead of a plane-parallel plate 111 that forms the first optical element of the projection lens. The system is designed such that light has a preferred polarization axis before it enters the projection lens, which, in particular, may be achieved by providing that the illumination device preceding the projection lens is configured such that it emits partially polarized light having a prescribable degree of polarization. In order to, if necessary, have depolarized light in the vicinity of the reticle, the vicinity of the object plane 101 may be arranged between two optical elements, the first of which transforms the incident partially polarized light into circularly polarized light, while that following the reticle transforms that circularly polarized light into largely linearly polarized light. These optical elements, which maybe be laid out in a sandwich arrangement about the reticle, may, for example, be formed from quarter-wave plates.

After transiting the entrance plate 111, this light, which will be largely linearly polarized before it enters the beamsplitter 106, is incident on a positive lens 112 arranged immediately preceding the beamsplitter 106 that, among other things, collects and collimates the diverging rays coming from the object in order that variations in their angles of incidence (also called incidence angles) in the vicinity of the beamsplitter will not be too large on the first pass. The incidence angles therein vary by about ±10° from the approximately 45°-angle between the beamsplitting surface and the optical axis. Within the beamsplitter, light transits its planar beamsplitting surface 107, which is inclined at an angle of about 45° with respect to the optical axis and, in the case of this sample embodiment, is configured such that it transmits incident light, which is p-polarized with respect to the plane of incidence, and transmits it toward concave mirror 109. After transiting the beamsplitter, it transits a quarter-wave plate (not shown), passes through a pair of large-diameter negative lenses 113, 114 arranged in the immediate vicinity of the concave mirror 109, and strikes the reflecting surface of the concave mirror 109. Following its reflection by the concave mirror, light, which, in the vicinity of the concave mirror, is circularly polarized, passes through the quarter-wave plate, which retransforms it into linearly polarized light whose polarization axis has been rotated through 90° with respect to its original polarization axis, a second time. The beamsplitting surface 107 will then reflect this s-polarized light, in order that light reflected by the concave mirror will be deflected toward the dioptric second lens section that follows the beamsplitter. Here light initially transits a positive lens 115 arranged in the immediate vicinity of the beamsplitter, that is arranged between the beamsplitter and the intermediate image 102 and spaced at a distance from the intermediate image. The deflecting mirror 110 deflects light coming from the intermediate image toward the other optical components 116–130 of the dioptric lens section, which images the intermediate image 102 onto the image plane 103.

The optical data for the lenses and other elements of this embodiment are summarized in Table 1, where the leftmost column lists the number of the refractive, reflective, or otherwise designated surface involved, the second column lists the radius, r, of that surface [mm], the third column states whether the surface involved is aspherical (AS), the fourth column lists the distance, d [mm], between the surface involved and the next surface, a parameter that is referred to therein as the "thickness" of the optical element that follows the surface in question, the fifth column lists the material employed for fabricating that optical element, the sixth column lists the refractive index of that materials, and the seventh column lists the clear (usable) radii of the surface in question. The eighth column lists the designations of several surfaces.

In the case of the embodiment depicted in FIG. 1, eight surfaces, namely surfaces 4, 11 or 13, 28, 31, 42, 47, 49, and 51, are aspherical. Table 2 lists the associated data for those aspherical surfaces, from which their shapes may be computed employing the following equation:

$$p(h)=[((1/r)h^2)/(1+SQRT(1(1+K)(1/r)^2h^2)]+C1 \cdot h^4 C2 \cdot h^6+ \ldots,$$

where r is the local radius of curvature of the surface in question and h is the distance of a point thereon from the optical axis. p(h) thus represents the distance of that point from the vertex of the surface in question, measured along the z-direction, i.e., along the optical axis. The constants K, C1, C2, etc., are listed in Table 2.

The optical system 100 that may be reproduced employing that data is designed for use at a working wavelength of about 157 nm, for which the calcium fluoride employed for fabricating all of the lenses involved has a refractive index, n, of 1.55841. That system has object-field dimensions of 26 mm×7 mm. The image-end numerical aperture, NA, is 0.85.

Several beneficial features of that system will be described in greater detail below. In the case of the embodiment depicted, the beamsplitter 106 has a pair of right-angle prisms that are joined together in the vicinity of the beamsplitting surface 107 that form a beamsplitter cube (BSC). In the case of other embodiments, a shape other than this cubical shape may be provided. A thin optical coating that, on the first pass, transmits incident light, for example, light that is p-polarized with respect to the plane of incidence, and reflects the s-polarized light coming from the concave mirror, whose polarization axis has been rotated through 90°, to the deflecting mirror is provided in the vicinity of the beamsplitting surface. This beamsplitter is thus a polarization beamsplitter whose light losses are minimized compared to the case of employing partially transmitting reflective coatings in the vicinity of the beamsplitting surface, which is also feasible.

Figure 2:
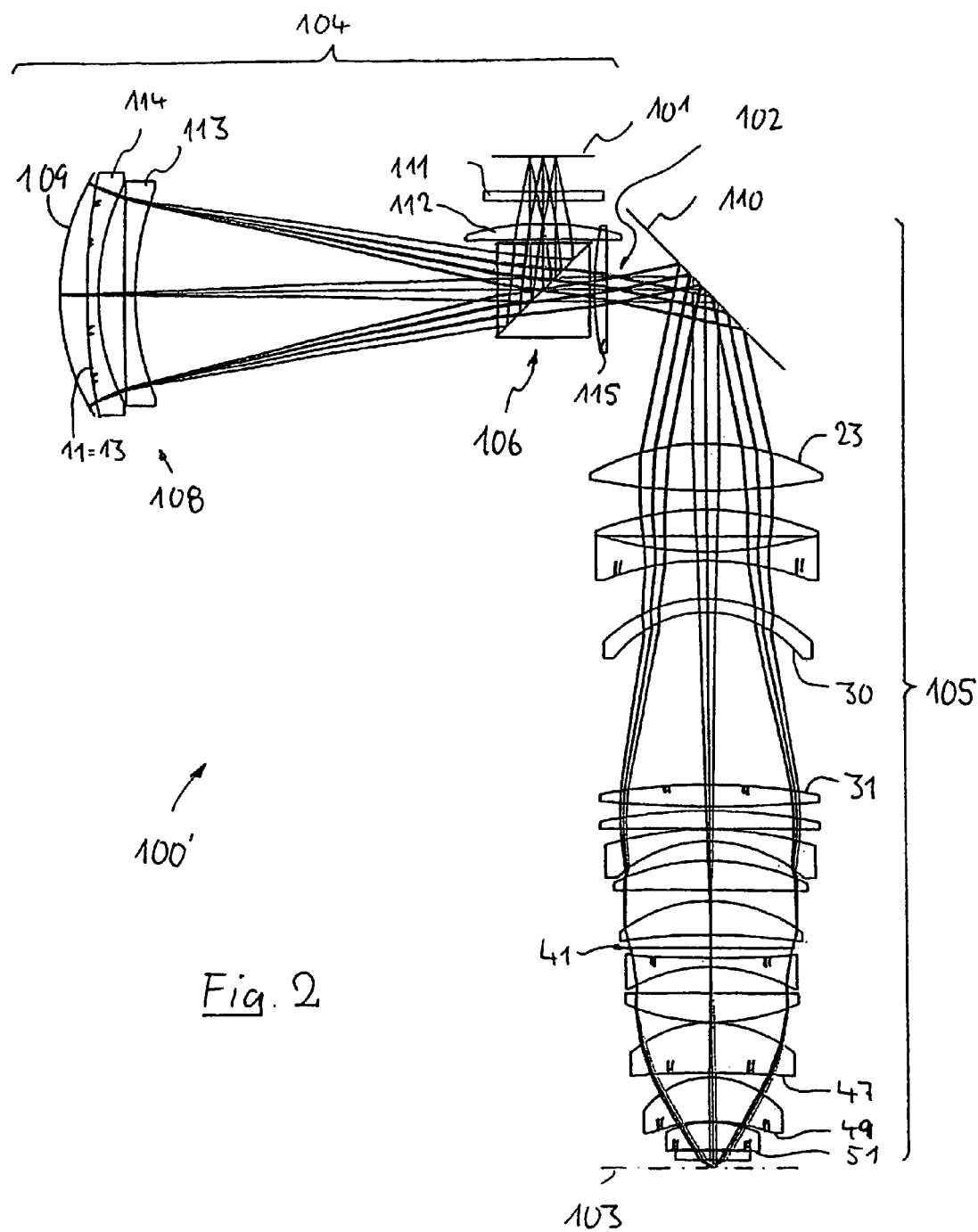
FIG. 2 is a sectioned view of the lenses of a second embodiment of the invention.

In the case of other embodiments, the beamsplitting coating provided at the beamsplitting surface is designed such that light coming from the object plane will initially be reflected toward a concave mirror that may be located on that end of the second lens section opposite the beamsplitter cube. Light reflected back to the beamsplitting coating by that concave mirror will then be transmitted to the second lens section, following rotation of its polarization axis. FIG. 2 and Tables 3 and 4 illustrate an example (second embodiment) of a projection lens 100' of that type that otherwise is no different from the embodiment depicted in FIG. 1 insofar as the types and arrangement of its optical surfaces are concerned.

Alternatively to those types of beamsplitters described above, physical beamsplitters may also be implemented by inserting a plane-parallel plate or other optical element(s) having a similar effect in the beam path inclined at an angle thereto. Beamsplitter plates having a free-form correcting surface that corrects for, for example, imaging errors, such as axial coma and axial astigmatism, are also feasible.

Compared to many conventional designs, the beamsplitter 106 is small, which means that a small volume of material is required for its fabrication. This, in the case of this particular embodiment, is attributable to the fact that the beamsplitter is arranged within a region where marginal-ray heights are low, where it is readily evident that it is arranged close to both the object plane and the intermediate image. In the case of the example depicted, the projection of the marginal-ray height at the beamsplitter onto a plane orthogonal to the optical axis at the point where the beamsplitting surface 107 intersects the optical axis is less than 70%, in particular, less than about 40%, of the marginal-ray height at the concave mirror. Small beamsplitter volume is also favorably influenced by the fact that a relatively strong refractive power is arranged within the optical near-field of the object plane 101. That refractive power is partly provided by positive lens 112 arranged ahead of the beamsplitter that collimates the diverging rays coming from the object and provides for both low marginal-ray heights and an only slightly divergent beam on the first pass of the beamsplitter. That positive lens 112 also favorably influences the object-end telecentricity of the projection lens. Another positive lens 115 is arranged in the vicinity of the intermediate image, where marginal-ray heights are less than about 30% of the marginal-ray height at the concave mirror. That positive lens favors low marginal-ray heights within the dioptric lens section, which allows employing a design for that section that conserves materials. These positive lenses 112, 115 also favorably affect the correction status of the intermediate image 102, in that they, for example, correct for distortion.

Since the optical system contains an intermediate image 102, there are two conjugate stop planes, one of which is situated in the vicinity of the concave mirror 109, while the second stop plane (surface 41) is freely accessible and situated between the positive meniscus lens 124 and the negative lens 125 in the second lens section that follows it in the optical train. Due to its accessibility, the latter lens should preferably be employed as the system stop. An aspherical surface (surface 42) that, precisely as in the case of the aspherical surface (surface 11 or 13) arranged in the vicinity of the concave mirror, may, preferably, be utilized for correcting for spherical aberration and coma, is also situated in the immediate vicinity of the system stop. This particular embodiment effectively corrects for distortion and other field aberrations, since near-field aspherical surfaces (aspherical surface situated near a field plane), for example, the entrance surface 4 of the first positive lens 112 of the projection lens, are also provided.

Achromatization of the projection lens is favorably influenced by the pair of negative lenses 113, 114 having large marginal-ray heights that immediately precede the concave mirror 109 and provide a large amount of negative refractive power within that lens section situated between the beamsplitter and the concave mirror. In the case of the example depicted, the absolute value of the combined negative refractive power of those negative lenses 113, 114 exceeds twice the reciprocal of the distance between the object plane and the concave mirror. No positive lenses are provided within that lens section, which allows designing these negative lenses such that their refracting surfaces have favorable, relatively low, curvatures. Further benefits in terms of greater mechanical stability and a favorable design of the projection lens arise from the fact that only two lenses are incorporated into that arm of the projection lens bearing the concave mirror 109.

It is beneficial that the lens section situated between the beamsplitter and the concave mirror is overcorrected for chromatic aberration, where, in the case of the example depicted, that overcorrection is configured such that as much as 70%, and even 80% to 90%, of the undercorrection of the other lens sections, namely, the positive lens 112 ahead of the beamsplitter and the entire lens arrangement following the beamsplitter, may be compensated.

Figure 3:
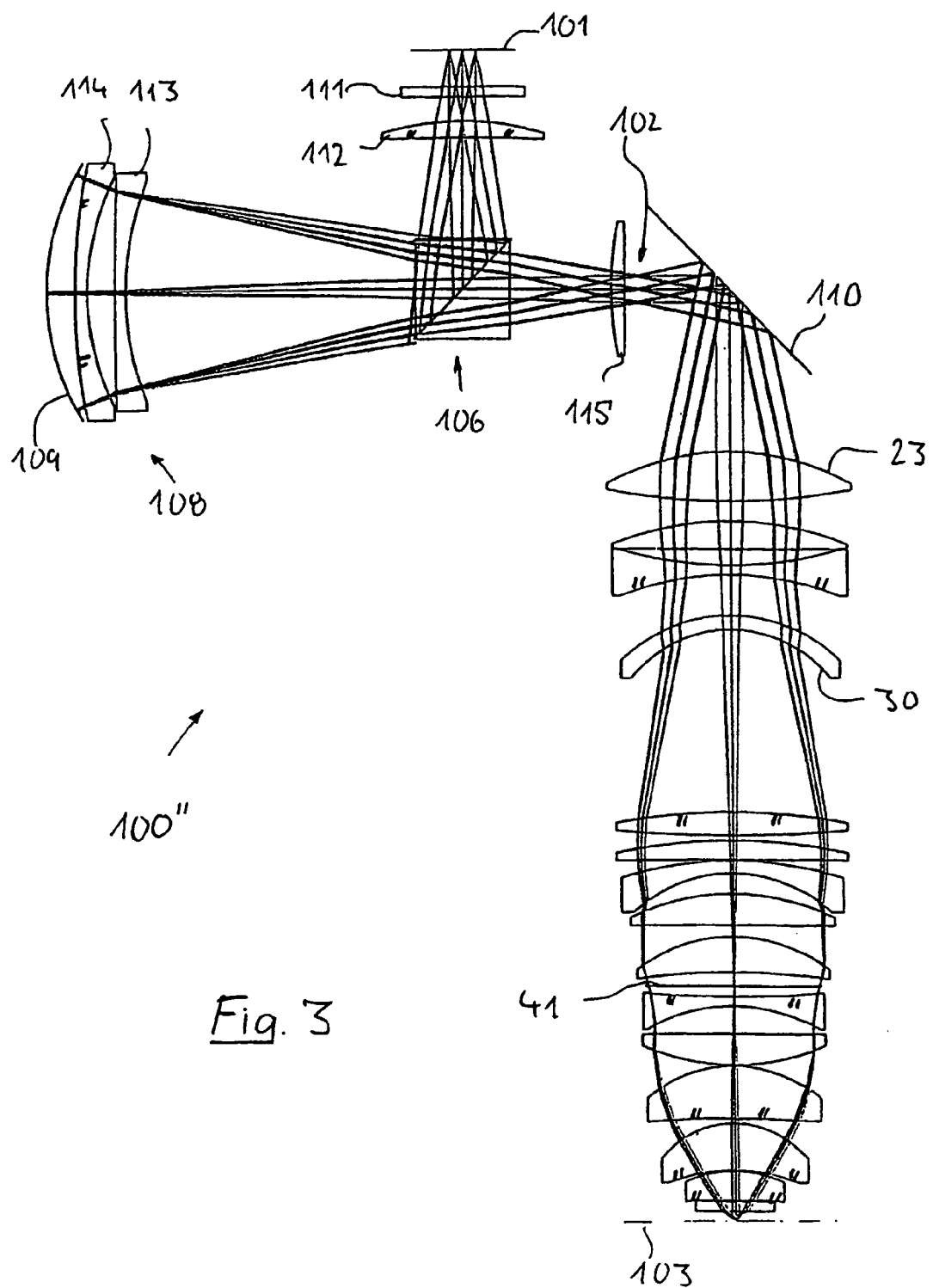
FIG. 3 is a sectioned view of the lenses of a third embodiment of the invention.

The specifications for the third embodiment of a projection lens 100" depicted in FIG. 3 are listed in Tables 5 and 6, where the numberings of the optical elements and optical surfaces appearing therein correspond to those employed in the case of the embodiment depicted in FIGS. 1 and 2. One of the major differences between the embodiment depicted in FIG. 3 and the aforementioned embodiments is that the axial distance between the first positive lens 112 following the object plane 101 and the beamsplitter that follows that lens in the optical train greatly exceeds those of the aforementioned embodiments, which allows increasing the distance, measured along the input axis, between the object plane 101 and the horizontal (when the projection lens is fully assembled) side arm incorporating the mirror group 108 This leaves more space available in that region for incorporating the components of the reticle stage than simpler alternative designs will allow. That benefit is obtained at the expense of a slight increase in the volume of the beamsplitter 106. However, in the case of this embodiment as well, the volume of the beamsplitter remains small, where, in particular, a semidiameter of the beamsplitter measured along a direction orthogonal to the optical axis may be much less than 70% or 60% of the radius of the concave mirror 109.

The various designs also shift the intermediate image 102 further away from the beamsplitter, i.e., closer to the deflecting mirror, and allow arranging the positive lens 115 arranged between those components at a large distance from the beamsplitter.

Figure 4:
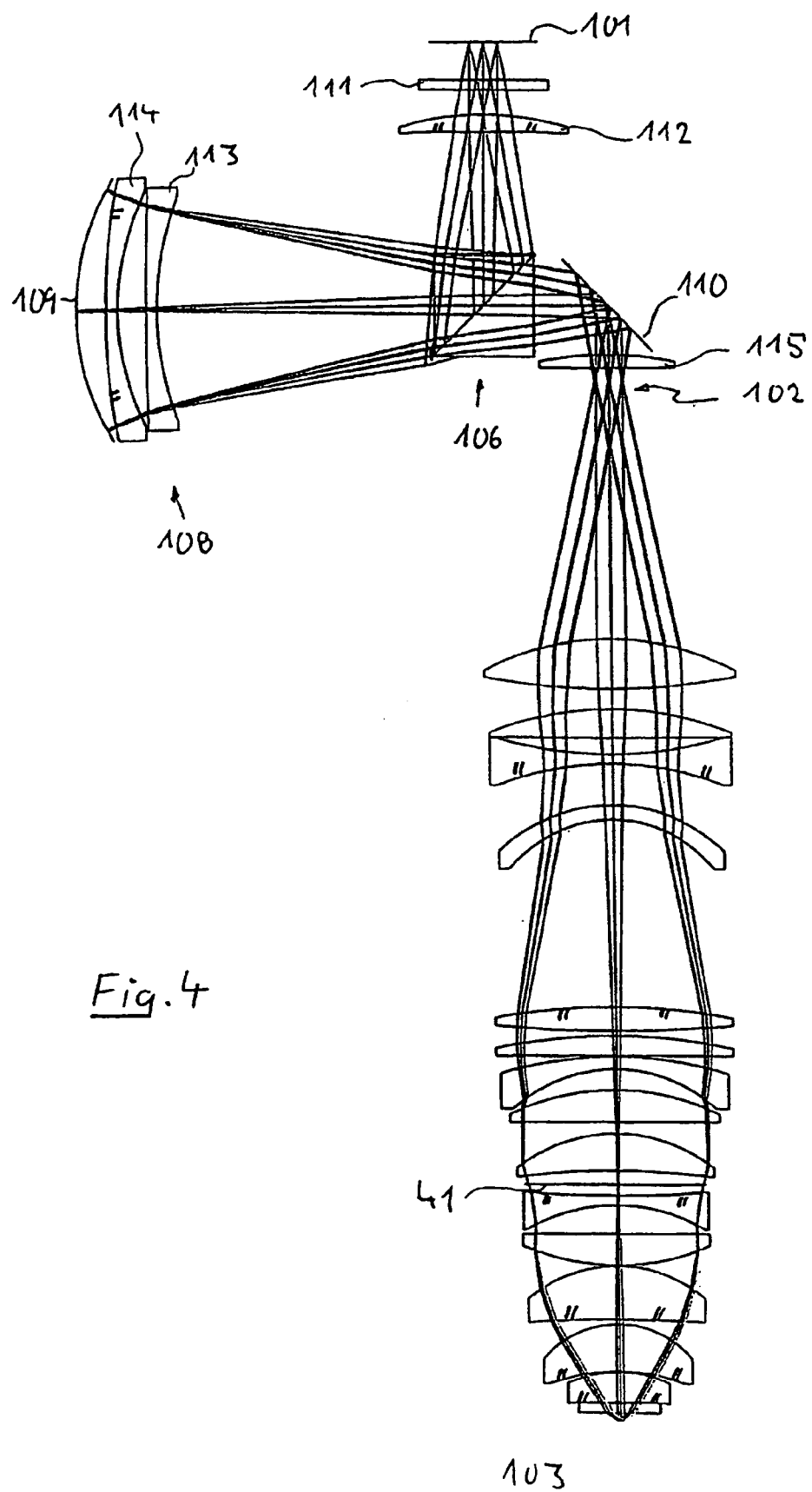
FIG. 4 is a sectioned view of the lenses of a fourth embodiment of the invention.

The fourth embodiment illustrated in FIG. 4 and Tables 7 and 8 represents yet another example of an embodiment of a doubly telecentric projection lens according to the invention that has a wafer-end image field measuring 26 mm×7 mm for a fourfold image demagnification and an image-end numerical aperture, NA, of NA=0.85 for full achromatization. The numberings of its optical elements and optical surfaces correspond to those of the foregoing sample embodiments. One major difference between this embodiment and the foregoing embodiments is that the first positive lens 115 following the beamsplitter 106 is arranged behind, rather than before, the deflecting mirror 110 and thus may be mounted horizontally, which keeps the intervening space between the beamsplitter and the deflecting mirror free of lenses. This embodiment provides benefits in terms of simpler lens mountings, since mechanically mounting lenses in a manner that will ensure a stable arrangement over the long term is usually easier if they are mounted in a horizontal arrangement (in the case of a vertical optical axis) rather than a vertical arrangement.

Figure 5:
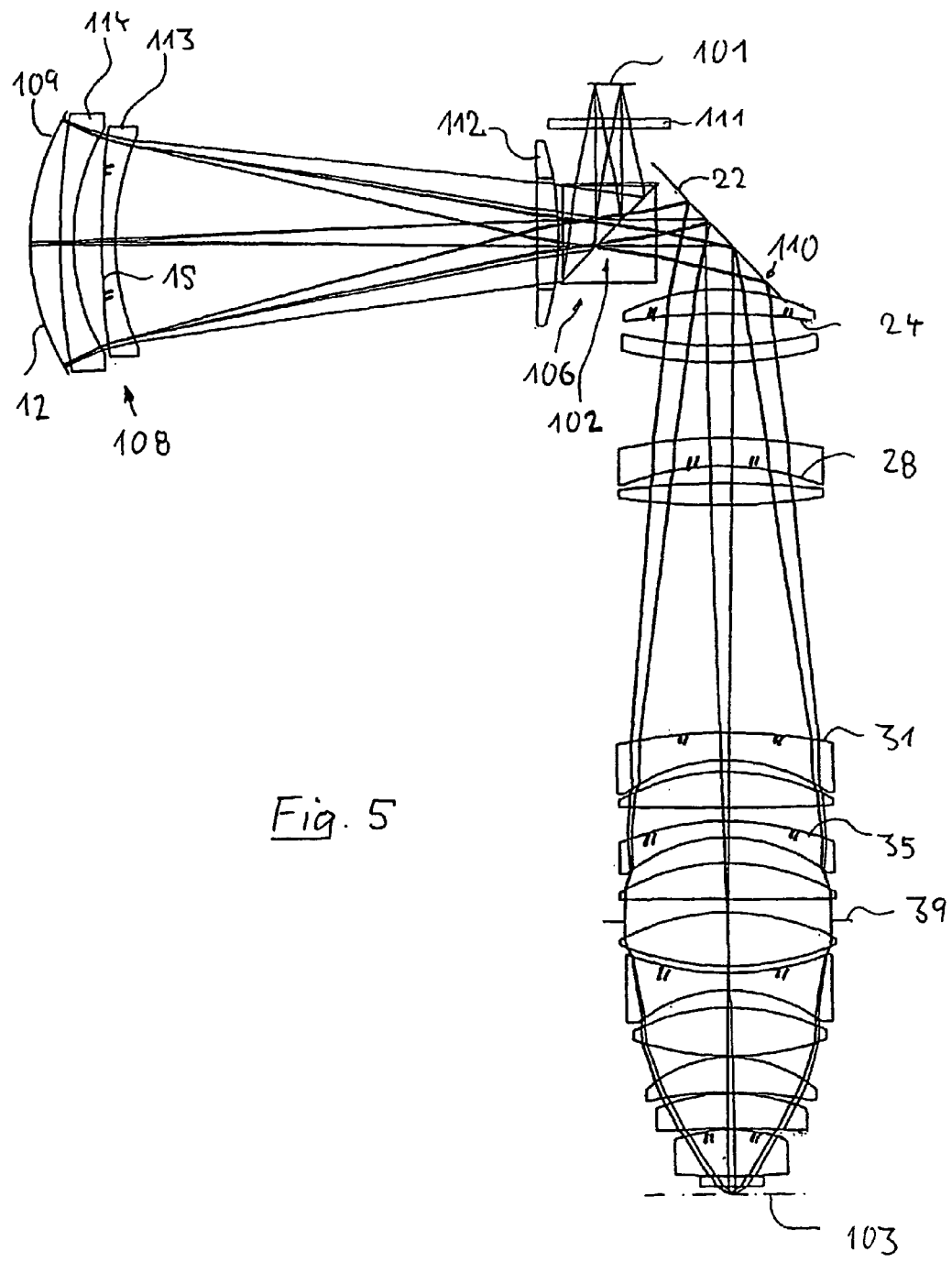
FIG. 5 is a sectioned view of the lenses of a fifth embodiment of the invention.

From the fifth embodiment illustrated in FIG. 5 and Tables 9 and 10, it may be seen that the space between the object plane 101 and the entrance surface of the beamsplitter may be kept free of optical elements, in particular, free of isolated lenses, in conjunction with the invention. In the case of this particular embodiment, all of the positive refractive power provided within the optical near-field of the object plane that, among other things, benefits object-end telecentricity, is provided by a single positive lens 112 that is arranged following the exit surface of the beamsplitter facing the concave mirror, between the beamsplitter and the mirror group. That lens, which is transited twice, provides that principal-ray heights along the optical path between the concave mirror 109 and the dioptric second lens section will be relatively low within that section, which will allow conserving lens materials due to the relatively small lens diameters that result. The positive lens 112 may also be relatively small, since it is situated in a vicinity where marginal-ray heights are low (less than 30% of the marginal-ray height at the concave mirror). In addition, adjusting the refractive power of that positive lens 112 will allow influencing the location of the intermediate image 102, which, in the case of the embodiment depicted, lies in the vicinity of the beamsplitting surface 107 within the beamsplitter 106.

The sixth embodiment of a reduction lens 200 illustrated in FIG. 6 and Tables 11 and 12 demonstrates that designs that allow keeping the range of angles of incidence on the beamsplitting surface narrow for at least one direction of propagation through the beamsplitting surface are also possible in conjunction with the invention. An entrance element 211 that has only a weak optical effect is followed by a meniscus lens 212 having a positive refractive power whose curved surfaces 3, 4 are curved toward the image plane. The lens is situated a short distance ahead of the entrance surface of the beamsplitter 206, which makes a major contribution to largely collimating the radiation incident on the beamsplitting surface 207 on the first pass thereof, where, in air, the angles between marginal rays and the optical axis at the physical beamsplitter on that first pass are less than about 10°, in particular, even less than about 5°. The nearly parallel beam transmitted through the beamsplitter toward the concave mirror 209 is expanded by three negative lenses 215, 213, 214, one of which (215) is arranged near the beamsplitter, while the other two (213, 214) are arranged within the mirror group 208 situated immediately ahead of the concave mirror 209. That lens 215 benefits an expansion of the convergent beam reflected by the concave mirror 209 in order that relatively minor variations in its angle of incidence on the beamsplitting surface will occur while it is on its way back to the beamsplitting surface 207. A lens group having a positive lens 216 arranged immediately ahead of the intermediate image 202 and meniscus lenses 217–219 that is arranged between the beamsplitter 206 and beam-deflecting mirror 210 largely corrects for third-order and higher-order distortion. Radiation reflected by the deflecting mirror is then focused onto the plane of the wafer by a multilens final lens section. This design also provides a freely accessible stop plane 49 within its refractive lens section, which is located near the wafer.

In the case of this particular design, the beamsplitting surface may, of course, also be adapted to suit the state of polarization of the light entering the system such that the beamsplitter will be employed in reflection on the first pass and in transmission on the second pass.

Another layout of a catadioptric reduction lens 100 in accordance with the invention is depicted in FIG. 7, based on a seventh embodiment, and serves to image a pattern on a reticle or similar arranged in an object plane 101 onto an image plane 103 on a reduced scale, for example, a scale of 4:1, while creating precisely one, real, intermediate image 102. The lens 100 has a catadioptric first lens section 104 that is followed by a purely dioptric second lens section 105 arranged between the object plane and image plane. That catadioptric lens section 104 comprises a physical beamsplitter 106 having a planar beamsplitting surface 107 that is inclined with respect to the optical axis and a mirror group 108 that includes an imaging concave mirror 109.

The reducing second lens section 105 has a planar deflecting mirror 110 inclined with respect to the optical axis that, in combination with the reflection at the beamsplitting surface 107, allows orienting the mask arranged in the object plane 101 parallel to wafers arranged in the image plane 103, which will simplify operating the mask and wafer in scanning mode, situated ahead of the intermediate image 102. Designs lacking a deflecting mirror or versions having more than one deflecting mirror are also feasible.

The layout between the object plane 101 and the beamsplitter 106 is similar to those depicted in FIGS. 1–4, which have a plane-parallel entrance plate 111 and a positive lens 112, where the latter is a meniscus lens whose curved surfaces are curved toward the object plane.

After transiting the entrance plate 111, this light, which will be largely linearly polarized no later than just before it enters the beamsplitter 106, is incident on a positive lens 112 arranged immediately ahead of the beamsplitter 106 that, among other things, collects and collimates the diverging rays coming from the object in order that variations in their angles of incidence in the vicinity of the beamsplitter will not be too large on the first pass thereof. The angles of incidence are within a range of ±10° around the inclination angle 18 of the normal to the beamsplitting surface 107 with respect to that segment 15 of the optical axis that is normal to the object plane. The inclination angle 18 is about 49° (cf. FIG. 8). Within the beamsplitter, light transits its planar beamsplitting surface 107, which, in the case of this particular example, is configured such that it reflects incident light, which is, e.g., s-polarized with respect to the plane of incidence, through a deflection angle 19 of about 98° toward concave mirror 109. The optical axis, whose segment 16 running between the beamsplitting surface 107 and the concave mirror 109 is thus tilted away from the object plane and toward the image plane, is folded through that angle. Light reflected by the beamsplitting surface transits a quarter-wave plate (not shown), passes through a pair of large-diameter negative lenses 113, 114 arranged in the immediate vicinity of the concave mirror 109, and strikes the reflecting surface of the concave mirror 109. Following its reflection by the concave mirror, light, which, in the vicinity of the concave mirror, is circularly polarized, passes through the quarter-wave plate, which retransforms it into linearly polarized light whose polarization axis has been rotated through 90° with respect to its original polarization axis, a second time. The beamsplitting surface 107 will then transmit this p-polarized light, in order that light reflected by the concave mirror will be transmitted toward the dioptric second lens section that follows the beamsplitter.

As soon as it exits the beamsplitter, light strikes the deflecting mirror 110 that follows the beamsplitter, where no optical components are present in the space between the two. That deflecting mirror is tilted with respect to the beam path such that the deflection angle 20 through which the optical axis is folded at the deflecting mirror 110 is 180°, minus the size of the deflection angle 19 between the first segment 15 and the second segment 16 of the optical axis. In this particular case, the angle 20 is about 92°, which orients that segment 15 of the optical axis that is normal to the object plane parallel to that segment 17 of the optical axis that is normal to the image plane 103. The deflecting mirror 110 is immediately followed by a positive lens 115 that further collects the converging rays at the deflecting mirror in order to create an intermediate image 102 that follows that lens in the optical train. As may be seen from FIG. 7, that lens may be truncated, i.e., be a semilens or a partial lens, in order to simplify arranging it close to the beamsplitter. The intermediate image, which lies outside, and follows, that positive lens 115 is thus arranged within the dioptric second lens section 105. Those optical components 116–130 that follow the intermediate image in the optical train serve to image the intermediate image onto the image plane 103 and correct for any residual imaging errors that may be present in the vicinity of the intermediate image 102.

The optical data for the lenses and other elements of this embodiment are summarized in Table 13. In the case of the embodiment depicted in FIG. 7, eight surfaces, namely surfaces 4, 11 or 13, 30, 33, 44, 49, 51, and 53, are aspherical. Table 14 lists the associated data for those aspherical surfaces.

The optical system 100 that may be reproduced employing that data is designed for use at a working wavelength of about 157 nm, for which the calcium fluoride employed for fabricating all of its transmitting optical components has a refractive index, n, of 1.55841. That system has object-field dimensions of 26 mm×7 mm. Its image-end numerical aperture, NA, is 0.85.

Several beneficial features of that system will be described in greater detail below. Since the beamsplitting surface is inclined with respect to that segment 15 of the optical axis that is normal to the object plane at an angle that is much greater than 45°, unlike conventional beamsplitters, the beamsplitter 106 allows a beam deflection that differs from 90° by a large margin, and, in particular, exceeds 90°, which allows arranging the beamsplitter block 106 relatively close to the object plane, without the concave-mirror group 108 physically intruding into the vicinity of the reticle stage (not shown), which extends into the object plane in order to hold a reticle to be arranged in the object plane 101 and scan it over the object plane. That proximity to the object plane also allows arranging the beamsplitter in a region where marginal-ray heights are low, which allows employing beamsplitters that have small volumes. The resultant reflection angles at their beamsplitting surfaces will also differ from those of conventional beamsplitters, since the mean angles of incidence on their beamsplitting surfaces will be shifted toward larger angles of incidence, which creates new degrees of freedom in the field of coating design. Regarding the distribution of angles of incidence, the relationships at the deflection mirror 110 that immediately follows the beamsplitter are reversed, since it deflects incident radiation through much less than 90°, namely, through about 82°. The deflecting mirror may thus be coated with a reflective coating that is designed for a mean angle of incidence of about 41°, which, presumably, will allow arriving at more favorable coating designs, and perhaps, higher reflectances, than for the case where conventional 45°-mirrors are employed. Favorable inclination angles might, e.g., range from about 35° to about 42°–44°.

In the case of the embodiment depicted, the beamsplitter 106 has a pair of oblique-angle prisms that are joined together to form beamsplitting surface 107 and that form a trapezoidal beamsplitter cube that is termed a "beamsplitter cube" (BSC), in spite of its departure from a cubical shape. In the case of other embodiments, beamsplitters having other shapes may be provided, where shapes whose volume is optimized such that their total volume only slightly exceeds the maximum illuminated volume are preferred in order to conserve materials. Polarization beamsplitters of the type described here whose light losses in the vicinity of their beamsplitting surface have been minimized compared to the case of partially transmitting reflective coatings, which are also feasible, are preferred.

The space between the beamsplitter 106 and the deflecting mirror 110 is free of lenses, which provides benefits in terms of simpler lens mountings, since mechanically mounting lenses in a manner that will ensure a stable arrangement over the long term is usually easier if they are mounted in a horizontal arrangement (in the case of a vertical optical axis) rather than a vertical arrangement. Moreover, due to the inclination of the second segment 16 of the optical axis, special mountings would be required here in order to allow mounting lenses tilted off-axis. However, that is avoided in the case of the embodiment depicted.

In the case of other embodiments, the beamsplitting coating provided in the vicinity of the beamsplitting surface is designed such that light coming from the object plane is initially transmitted toward a concave mirror arranged on an extension of the first segment 15 of the optical axis that is arranged on that side of the beamsplitter opposite the object plane. Light reflected back to the beamsplitter is then reflected to the second lens section, following a rotation of its polarization axis. The beamsplitting surface may be inclined with respect to the optical axis at an angle that differs from 45°, such that, in the case of embodiments of this type as well, a segment 15 of the optical axis transverse to the beam path will be tilted away from the object plane, commencing at the beamsplitter cube, instead of running parallel to the object plane.

Regarding the size of the beamsplitter, its arrangement in the vicinity of low marginal-ray heights, the intermediate image, aspherical surfaces, and achromatization, those statements made for the first embodiment apply to this seventh embodiment without exception, or in an analogous sense.

Figure 9:
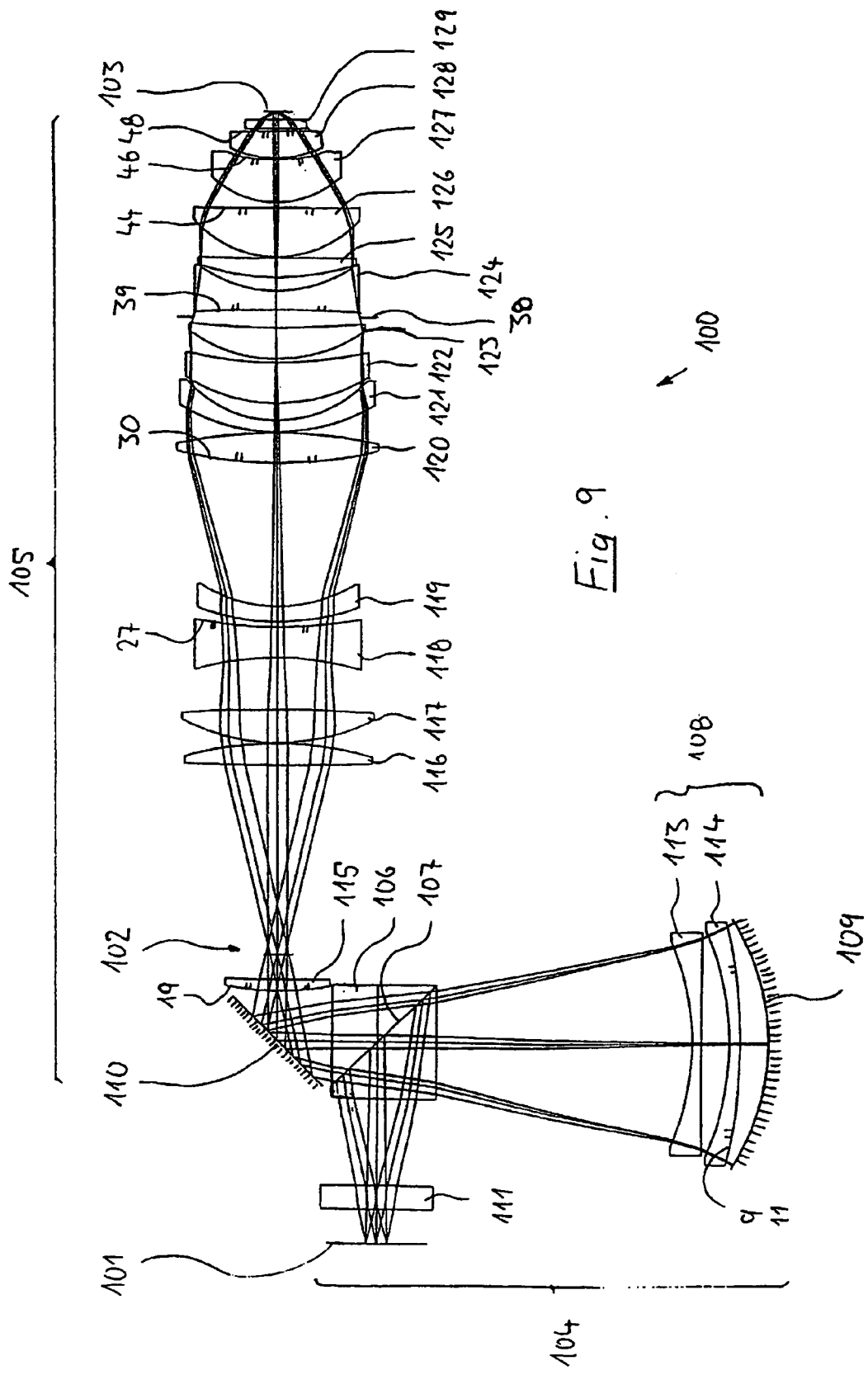
FIG. 9 is a sectioned view of the lenses of an eighth embodiment of the invention.

An alternative design for a catadioptric reduction lens 100 according to the invention is depicted in FIG. 9, and serves to project an image of a pattern on a reticle or similar arranged in an object plane 101 onto an image plane 103 on a reduced scale, for example, a scale of 4:1, while creating precisely one, real, intermediate image 102. The lens has a catadioptric first lens section 104 that is followed by a purely dioptric second lens section 105.

That projection lens has a planar deflecting mirror 110 inclined at an angle of 45° with respect to the optical axis that, in combination with the reflection at the beamsplitting surface 107, allows orienting a mask arranged in the object plane 101 parallel to a wafer arranged in the image plane 103. Instead of this angled layout, the second lens section might have either a linear layout lacking a deflecting mirror or be based on a version thereof having more than one deflecting mirror. Inclination angles of the beamsplitting surface that are much greater, or much less, than 45°, for example, that differ therefrom by amounts ranging from about 1° to about 10°, are also feasible, which will allow, e.g., inclining the side arm bearing the concave mirror, which will leave more vacant space available in the vicinity of the reticle plane.

As may be seen from FIG. 9, light from an illumination system (not shown) enters the projection lens from that side of the object plane 101 that faces away from the image plane, in the course of which it passes through the mask arranged in the object plane, which is arranged at an object-end working distance exceeding 30 mm ahead of a plane-parallel plate 111 that forms the first optical element of the projection lens. The system is designed such that light has a preferred polarization axis before it enters the projection lens, which, in particular, may be achieved by providing that the illumination device preceding the projection lens is configured such that it emits partially polarized light having a prescribable degree of polarization. Versions for use with circularly polarized incident light having a sandwich arrangement of λ/4 plates about the reticle (cf. FIG. 1) are also feasible.

After transiting the entrance plate 111, this light, which will be largely linearly polarized no later than just before it enters the beamsplitter 106, immediately strikes the beamsplitter 106, since no lenses are arranged between the beamsplitter and the object plane. Within the beamsplitter, light strikes its planar beamsplitting surface 107, which is inclined at an angle of about 45° with respect to the optical axis and, in the case of this sample embodiment, is configured such that it reflects incident light, which is, e.g., s-polarized with respect to the plane of incidence, and deflects it toward concave mirror 109. After transiting the beamsplitter, it transits a quarter-wave plate (not shown), passes through a pair of large-diameter negative lenses 113, 114 arranged in the immediate vicinity of the concave mirror 109, and strikes the reflecting surface of the concave mirror 109. Following its reflection by the concave mirror, light, which, in the vicinity of the concave mirror, is circularly polarized, passes through the quarter-wave plate, which retransforms it into linearly polarized light whose polarization axis has been rotated through 90° with respect to its original polarization axis, a second time. The beamsplitting surface 107 will then transmit this p-polarized light, in order that light reflected by the concave mirror will be transmitted toward the dioptric second lens section that follows the beamsplitter. Light coming from the beamsplitter is deflected by deflecting mirror 110 toward the other optical components 115–129 of the dioptric lens section, where the first lens 155 of the second lens section, which has a positive refractive power, lies ahead of the intermediate image, which lies at a freely accessible location within a segment of the second lens section that is free of lenses.

The optical data for those lenses and the other elements of this embodiment are summarized in Table 15. In the case of the embodiment depicted in FIG. 9, eight surfaces, namely surfaces 9 or 11, 19, 27, 30, 39, 44, 46, and 48 are aspherical. Table 16 lists the associated data for those aspherical surfaces.

Several beneficial features of that system will be described in greater detail below. In the case of the embodiment depicted, the beamsplitter 106 has a pair of right-angle prisms that are joined together in the vicinity of the beamsplitting surface 107 that form a beamsplitter cube (BSC). In the case of other embodiments, a shape other than this cubical shape may be provided. In the case of other embodiments, the beamsplitter coating provided in the vicinity of the beamsplitting surface 107 is designed such that light coming from the object plane will initially be transmitted toward a concave mirror that may be situated on that side of the beamsplitter cube that faces away from the object plane. Light reflected by the concave mirror back to the beamsplitter cube will then reflected to the second lens section following a rotation of its polarization axis.

Alternatively to those types of beamsplitters described above, physical beamsplitters may also be implemented by inserting a plane-parallel plate or other optical element(s) having a similar effect in the beam path inclined at an angle thereto. Beamsplitter plates having a free-form correcting surface that corrects for, for example, imaging errors, such as axial coma and axial astigmatism, are also feasible.

Compared to many conventional designs, the beamsplitter 106 is small, which means that a small volume of material is required for its fabrication, which, in the case of this particular embodiment, is attributable to the fact that the beamsplitter is arranged within a vicinity where marginal-ray heights are low, where it should be readily evident that it is arranged close to both the object plane and the intermediate image. In the case of this particular example, the projection of the marginal-ray height at the beamsplitter onto a plane orthogonal to the optical axis at the point where the beamsplitting surface 107 intersects the optical axis is less than 70%, in particular, less than about 40%, of the marginal-ray height at the concave mirror, which is also favorably influenced by the fact that no lenses are arranged between the object plane and the image plane in order that the beamsplitter may be moved relatively close to the object plane, i.e., within a vicinity where marginal-ray heights are low. The catadioptric section 104 contains no positive lenses at all, since only negative lenses, namely two lenses 113, 114 are arranged between the beamsplitter and the concave mirror 109. The entire positive refractive power of that section is provided by the concave mirror 109. The catadioptric section 104 thus has just two lenses, which is particularly beneficial to the assembly, mechanical stability, materials requirements, alignment, and transmittance of the projection lens.

The first positive lens 115 following the object plane is situated within the second lens section 105, within the near-field of the intermediate image, where marginal-ray heights are less than about 30% of the marginal-ray height at the concave mirror. That positive lens favors low marginal-ray heights within the dioptric lens section, which allows employing a design for that section that conserves materials. That positive lens 115 also favorably affects the correction status of the intermediate image 102, in that it, for example, corrects for distortion.

The first positive lens 115 following the beamsplitter 106 is arranged following the deflecting mirror 110 and thus may be mounted horizontally, which keeps the intervening space between the beamsplitter and the deflecting mirror free of lenses. This embodiment provides benefits in terms of simpler lens mountings, since mechanically mounting lenses in a manner that will ensure a stable arrangement over the long term is usually easier if they are mounted in a horizontal arrangement (in the case of a vertical optical axis) rather than a vertical arrangement.

The projection lens is nontelecentric on its object end, where the angles of principal rays that are not parallel to the optical axis at the object plane may be beneficially influenced by a suitable choice of the refractive power of the positive lens 115, which will allow adapting it to suit illumination systems that have nontelecentric exits. A departure from object-end telecentricity may also be beneficial in cases where reflective masks are employed.

A nontelecentric object-end beam path for which the principal rays converge from the edges of the image field to the center of the beamsplitter allows employing a particularly compact, low-volume, beamsplitter design. Since no refractive components are situated between the object plane and the beamsplitter, the beamsplitter may be moved closer to the object field, which also favors a small beamsplitter volume. In the case of an embodiment that is identical, or similar, to that depicted in FIG. 9, the beamsplitter is fabricated from lithium fluoride, which may be replaced by a mixed, lithium-fluoride-based, crystal, if necessary. Lithium fluoride has much lower intrinsic stress-birefringence coefficients than calcium fluoride, which may also be employed, which will allow optimizing the polarization characteristics of the beamsplitter design, which will be particularly beneficial in conjunction with the small beamsplitter volume employed here, which allows keeping the length of the optical path within the slightly birefringent material short, and thus keeping the associated retardations small. Moreover, employing a small beamsplitter volume in conjunction with a deflecting mirror arranged immediately following the beamsplitter also favors maintaining a short axial distance between that segment of the optical axis passing through the center of the object field and that segment of the optical axis passing through the center of the image field, which facilitates a simple incorporation of such projection lenses in wafer steppers.

Since the optical system contains an intermediate image 102, there are two conjugate stop planes, one of which is situated in the vicinity of the concave mirror 109, while the second stop plane (surface 38) is freely accessible and situated between the positive meniscus lens 123 and the negative lens 124 in the second lens section that follows it in the optical train. Due to its accessibility, the latter lens should preferably be employed as the system stop. An aspherical surface (surface 39) that, precisely as in the case of the aspherical surface (surface 9 or 11) arranged in the vicinity of the concave mirror, may, preferably, be utilized for correcting for spherical aberration and coma, is also situated in the immediate vicinity of the system stop. This particular embodiment also allows effectively correcting for distortion and other field aberrations, since near-field aspherical surfaces, for example, the entrance surface 19 of the first positive lens 115 of the projection lens, are also provided.

Achromatization of the projection lens is particularly favorably influenced by the pair of negative lenses 113, 114 having large marginal-ray heights that immediately precede the concave mirror 109 and provide a large amount of negative refractive power within that lens section situated between the beamsplitter and the concave mirror. In the case of this particular example, the absolute value of the combined negative refractive power of those negative lenses 113, 114 exceeds twice the reciprocal of the distance between the object plane and the concave mirror. No positive lenses are provided within that lens section, which allows designing these negative lenses such that their refracting surfaces have favorable, relatively low, curvatures. Further benefits in terms of greater mechanical stability and a favorable design of the projection lens arise from the fact that only two lenses must be incorporated into that arm of the projection lens bearing the concave mirror 109.

It will be beneficial if that lens section situated between the beamsplitter and the concave mirror is overcorrected for chromatic aberration, where, in the case of this particular example, that overcorrection is configured such that as much as 70%, and even 80% to 90%, of the undercorrection of the entire lens section following the beamsplitter may be compensated, or that that undercorrection may be even overcompensated.

Figure 10:
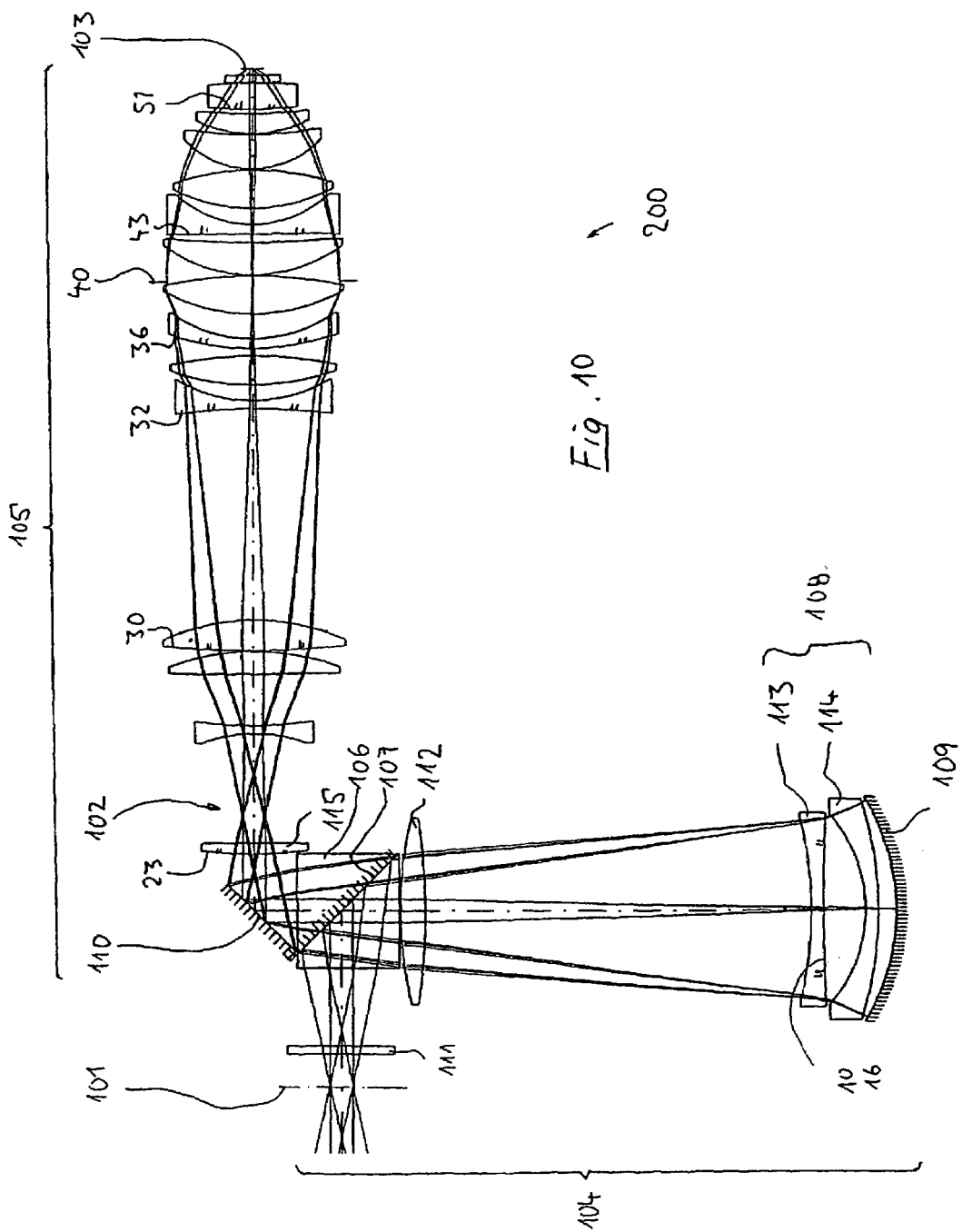
FIG. 10 is a sectioned view of the lenses of a ninth embodiment of the invention.

The ninth embodiment illustrated in FIG. 10 and Tables 17 and 18 represents yet another example of an embodiment of a doubly telecentric projection lens according to the invention that has a wafer-end image field measuring 26 mm×7 mm for a fourfold image demagnification and an image-end numerical aperture, NA, of NA=0.85 for full achromatization. The numberings of its optical elements and optical surfaces correspond to those of the foregoing sample embodiments.

Once again, it may be seen that the space between the object plane 101 and the entrance surface of the beamsplitter may be kept free of optical elements, in particular, free of isolated lenses. In the case of this particular embodiment, all of the positive refractive power provided within the optical near-field of the object plane is provided by a single positive lens 112 that is arranged following the exit surface of the beamsplitter facing the concave mirror, between the beamsplitter and the mirror group. That positive lens both provides for an object-end telecentricity of the projection lens and eliminates all field dependence of the angles of incidence on the beamsplitting surface 107. Rays from various fields will thus be incident on the beamsplitting coating at essentially identical angles, which will both simplify its design and help give it a more uniform optical effect. The maximum angle of incidence on the first pass of the beamsplitter falls within the approximate range±15°. The second positive lens 112, which is transited twice, also provides that principal-ray heights along the optical path between the concave mirror 109 and the second lens section will be relatively low within the second lens section, which will allow conserving lens materials due to the relatively small lens diameters that result.

In the case of this particular design, the beamsplitting surface may, of course, also be adapted to suit the state of polarization of the light entering the system such that the beamsplitter will be employed in transmission on the first pass and in reflection on the second pass.

All embodiments have a large number of features, only a few of which will be mentioned below. These systems are normally doubly telecentric in order that defocusing errors on both their reticle end and their wafer end will be avoided. A nontelecentric entrance, which is beneficial in cases where, e.g., reflective masks or objects, are employed, may be implemented in conjunction with the invention by adapting the refractive power of the first lens, or lens group, near the object to suit them, where the design principle underlying the invention will remain unaltered thereby. Numerical apertures, NA, of NA=0.85 are achieved for field dimensions of 26 mm×7 mm in all cases.

Any embodiment may have a plane-parallel, or nearly plane-parallel, plate, i.e., an optical element that has little or no optical effect, as its first optical element immediately following the object plane and/or its final optical element immediately ahead of the image plane, which will allow making the projection lens relatively insensitive to changes in the refractive index of flushing gas due to pressure fluctuations and, if necessary, physical damage.

The catadioptric section has a magnification of about 1. The major contribution to overall reduction (4:1) for all of these projection lenses is generated by their demagnifying, purely refractive, second lens section, where more positive lenses than negative lenses are situated following the plane of the aperture stop. Other overall image magnifications/demagnifications, for example, strong demagnifications, e.g., 100:1 or more, are also feasible in conjunction with the invention, which may be beneficial in the case of coarser mask patterns. Image magnification/demagnification may be altered, particularly by making changes to the second lens section.

Variations in incidence angle are slight for all deflecting mirrors, where the range of those variations should preferably be less than 30°. In particular, those incidence angles will be confined to the range extending from about 30° to about 60° in all cases, which will also allow employing mirrors that have simple, highly uniform, reflective coatings. In the case of embodiments for which beam deflections greater than, or less than, 90° appear beneficial due to the deflections that occur at their beamsplitter due to its construction and or beam deflections at one or more beam-deflecting mirrors, that will be readily possible in conjunction with the invention. However, the stated ranges of angles of incidence should be correspondingly adjusted.

It is particularly beneficial if the maximum lateral dimension of the beamsplitter blocks is less than 70% of the diameter of the concave mirror, in many cases, even less than about 50% of that diameter. All embodiments also allow employing beamsplitter blocks that have shapes, for example, a regular or irregular minimal shape of the bulk material, other than a cubical shape. In particular, the shape of their beamsplitter block may be adapted to suit the beam path within the beamsplitter such that essentially no unilluminated zones remain. A block whose volume has been optimized may, for example, have a cubical shape.

The invention, which has been described based on several, selected, sample embodiments, allows providing on-axis optical systems that provide telecentric object-end and image-end beam paths, a working distance that is adequate for microlithography, and full correction of longitudinal chromatic aberration (CHL), as well as allow maintaining reasonable ranges of incidence angles on a beamsplitting surface, combined with small volumes of material for fabricating their physical beamsplitter. These benefits may be achieved for high image-end numerical apertures, where numerical apertures, NA, in excess of 0.7, or even 0.8, are feasible. Their image fields may also be enlarged, compared to those of conventional designs.

The above description of the preferred embodiments has been given by way of example. From the disclosure given, those skilled in the art will not only understand the present invention and its attendant advantages, but will also find apparent various changes and modifications to the structures and methods disclosed. It is sought, therefore, to cover all such changes and modifications as fall within the spirit and scope of the invention, as defined by the appended claims, and equivalents thereof.

TABLE 1

| Surface No. | Radius [mm] | Aspherical | Thickness/Spacing [mm] | Substrate Material | Refractive Index at 157.63 nm | One-Half Clear Diameter [mm] | |
|---|---|---|---|---|---|---|---|
| 0 | 0 | | 38 | | 1 | 53.852 | Reticle |
| 1 | 0 | | 10 | CAF2 | 1.5584098 | 61.454 | |
| 2 | 0 | | 24.9998271 | | 1 | 62.728 | |
| 3 | 297.18673 | | 17 | CAF2 | 1.5584098 | 69.424 | |
| 4 | 3760.17196 | AS | 5 | | 1 | 69.796 | |
| 5 | 0 | | 50 | CAF2 | 1.5584098 | 70.121 | |
| 6 | 0 | | 50 | CAF2 | 1.5584098 | 74.489 | BSC entry surface |
| 7 | 0 | | 406.211301 | | 1 | 75.339 | |
| 8 | −309.214616 | | 11.5 | CAF2 | 1.5584098 | 108.103 | |
| 9 | −5284.11887 | | 29.7080002 | | 1 | 113.668 | |
| 10 | −262.399253 | | 12.5 | CAF2 | 1.5584098 | 114.929 | |
| 11 | −842.345508 | AS | 29.8064246 | | 1 | 124.8 | |
| 12 | −257.306004 | | −29.8064246 | | −1 | 127.885 | Concave mirror |
| 13 | −842.345508 | AS | −12.5 | CAF2 | −1.5584098 | 123.131 | |
| 14 | −282.399253 | | −29.7080002 | | −1 | 110.077 | |
| 15 | −284.11887 | | −11.5 | CAF2 | −1.5584098 | 106.597 | |
| 16 | −309.214616 | | −406.211301 | | −1 | 100.38 | |
| 17 | 0 | | −50 | CAF2 | −1.5584098 | 62.656 | |
| 18 | 0 | | 50 | CAF2 | 1.5584098 | 61.538 | BSC reflecting surface |
| 19 | 0 | | 4.99981362 | | −1 | 56.8 | |
| 20 | 352.193263 | | 13.6846692 | CAF2 | 1.5584098 | 55.947 | |
| 21 | −7219.79266 | | 198.998488 | | 1 | 54.91 | |
| 22 | 0 | | −78.3243428 | | −1 | 110.383 | Deflecting mirror |
| 23 | −265.53614 | | −51.89466 | CAF2 | −1.5584098 | 118.441 | |
| 24 | 671.546195 | | −21.1104442 | | −1 | 117.797 | |
| 25 | −328.403608 | | −29.4824766 | CAF2 | −1.5584098 | 108.863 | |
| 26 | 20985.0561 | | −17.081681 | | −1 | 106.32 | |
| 27 | 408.33753 | | −10 | CAF2 | −1.5584098 | 104.888 | |
| 28 | −320.597753 | AS | −42.7289637 | | −1 | 99.662 | |
| 29 | −163.612925 | | −15 | CAF2 | −1.5584098 | 98.737 | |
| 30 | −133.401003 | | −192.185202 | | −1 | 93.434 | |
| 31 | −661.250408 | AS | −24.4771262 | CAF2 | −1.5584098 | 110.614 | |
| 32 | 1400.56504 | | −5.14399888 | | −1 | 110.635 | |
| 33 | −576.607436 | | −20.0867201 | CAF2 | −1.5584098 | 109.807 | |
| 34 | −10238.6915 | | −1.00143065 | | −1 | 108.841 | |
| 35 | −391.155057 | | −13 | CAF2 | −1.5584098 | 106.65 | |
| 36 | −153.692699 | | −21.2818355 | | −1 | 99.884 | |
| 37 | −241.974387 | | −32.5943881 | CAF2 | −1.5584098 | 101.011 | |
| 38 | −7533.68955 | | −12.0511708 | | −1 | 100.357 | |
| 39 | −165.09887 | | −36.9993124 | CAF2 | −1.5584098 | 96.778 | |
| 40 | −717.184237 | | −14.374126 | | −1 | 93.29 | |
| 41 | 0 | | −11.0867942 | | −1 | 90 | Aperture stop |
| 42 | 1999.38636 | AS | −10 | CAF2 | −1.5584098 | 88.453 | |
| 43 | −183.563743 | | −28.6894623 | | −1 | 85.346 | |
| 44 | −10343.5384 | | −32.1011472 | CAF2 | −1.5584098 | 86.611 | |
| 45 | 242.796866 | | −0.99985104 | | −1 | 88.094 | |
| 46 | −141.008981 | | −54.4544334 | CAF2 | −1.5584098 | 85.149 | |
| 47 | −1068.73543 | AS | −5.06814455 | | −1 | 76.827 | |
| 48 | −98.985445 | | −47.8700561 | CAF2 | −1.5584098 | 65.031 | |
| 49 | −187.562502 | AS | −1.48761752 | | −1 | 47.758 | |
| 50 | −131.529486 | | −29.9998809 | CAF2 | −1.5584098 | 45.327 | |

TABLE 1-continued

| Surface No. | Radius [mm] | Aspherical | Thickness/Spacing [mm] | Substrate Material | Refractive Index at 157.63 nm | One-Half Clear Diameter [mm] | |
|---|---|---|---|---|---|---|---|
| 51 | 5286.47237 | AS | −1.1030213 | | −1 | 31.761 | |
| 52 | 0 | | −10 | CAF2 | −1.5584098 | 30.321 | |
| 53 | 0 | | −8 | | −1 | 24.291 | |
| 54 | 0 | | 0 | | −1 | 13.463 | Wafer |

TABLE 2

Asphericity Constants

Surface No. 4

| K | 0.00000000E+00 |
|---|---|
| C1 | 1.35111881E−08 |
| C2 | 7.34681503E−14 |
| C3 | 1.95870959E−18 |
| C4 | 9.89975829E−24 |
| C5 | −7.02333698E−26 |
| C6 | 0.00000000E+00 |
| C7 | 0.00000000E+00 |
| C8 | 0.00000000E+00 |
| C9 | 0.00000000E+00 |

Surface No. 11

| K | 0.00000000E+00 |
|---|---|
| C1 | −8.50589208E−09 |
| C2 | 7.80175948E−14 |
| C3 | −2.46202626E−18 |
| C4 | 4.10885604E−23 |
| C5 | −9.25866796E−28 |
| C6 | 0.00000000E+00 |
| C7 | 0.00000000E+00 |
| C8 | 0.00000000E+00 |
| C9 | 0.00000000E+00 |

Surface No. 13

| K | 0.00000000E+00 |
|---|---|
| C1 | −8.50589208E−09 |
| C2 | 7.80175948E−14 |
| C3 | −2.46202626E−18 |
| C4 | 4.10885604E−23 |
| C5 | −9.25866796E−28 |
| C6 | 0.00000000E+00 |
| C7 | 0.00000000E+00 |
| C8 | 0.00000000E+00 |
| C9 | 0.00000000E+00 |

Surface No. 28

| K | 0.00000000E+00 |
|---|---|
| C1 | −6.70030705E−09 |
| C2 | 1.11723923E−13 |
| C3 | 6.44584551E−18 |
| C4 | 2.18805698E−23 |
| C5 | 1.19347613E−26 |
| C6 | 0.00000000E+00 |
| C7 | 0.00000000E+00 |
| C8 | 0.00000000E+00 |
| C9 | 0.00000000E+00 |

Surface No. 31

| K | 0.00000000E+00 |
|---|---|
| C1 | 1.35154352E−09 |
| C2 | −1.52293143E−13 |
| C3 | −8.28438403E−19 |
| C4 | −3.54133855E−23 |
| C5 | −3.23740835E−27 |
| C6 | 0.00000000E+00 |
| C7 | 0.00000000E+00 |
| C8 | 0.00000000E+00 |
| C9 | 0.00000000E+00 |

TABLE 2-continued

Asphericity Constants

Surface No. 42

| K | 0.00000000E+00 |
|---|---|
| C1 | 2.87049613E−08 |
| C2 | −1.03867207E−12 |
| C3 | 1.03128306E−17 |
| C4 | −1.39631135E−21 |
| C5 | 1.03923291E−25 |
| C6 | 0.00000000E+00 |
| C7 | 0.00000000E+00 |
| C8 | 0.00000000E+00 |
| C9 | 0.00000000E+00 |

Surface No. 47

| K | 0.00000000E+00 |
|---|---|
| C1 | 1.95783990E−08 |
| C2 | −9.62681014E−13 |
| C3 | −1.42156765E−16 |
| C4 | 5.05778442E−21 |
| C5 | −3.99717591E−25 |
| C6 | 0.00000000E+00 |
| C7 | 0.00000000E+00 |
| C8 | 0.00000000E+00 |
| C9 | 0.00000000E+00 |

Surface No. 49

| K | 0.00000000E+00 |
|---|---|
| C1 | 1.95783990E−08 |
| C2 | −9.62681014E−13 |
| C3 | −1.42156765E−16 |
| C4 | 5.05778442E−21 |
| C5 | −3.99717591E−25 |
| C6 | 0.00000000E+00 |
| C7 | 0.00000000E+00 |
| C8 | 0.00000000E+00 |
| C9 | 0.00000000E+00 |

Surface No. 51

| K | 0.00000000E+00 |
|---|---|
| C1 | −1.13795121E−07 |
| C2 | −3.18085962E−11 |
| C3 | −8.97407796E−16 |
| C4 | 2.82851591E−18 |
| C5 | −1.86773983E−21 |
| C6 | 0.00000000E+00 |
| C7 | 0.00000000E+00 |
| C8 | 0.00000000E+00 |
| C9 | 0.00000000E+00 |

TABLE 3

| Surface No. | Radius [mm] | Aspherical | Thickness/ Spacing [mm] | Substrate Material | Refractive Index at 157.63 nm | One-Half Clear Diameter [mm] | |
|---|---|---|---|---|---|---|---|
| 0 | 0 | | 38 | | 1 | 53.852 | Reticle |
| 1 | 0 | | 10 | CAF2 | 1.5584098 | 61.454 | |
| 2 | 0 | | 24.9998271 | | 1 | 62.728 | |
| 3 | 297.18673 | | 17 | CAF2 | 1.5584098 | 69.424 | |
| 4 | 3760.17196 | AS | 5 | | 1 | 69.796 | |
| 5 | 0 | | 50 | CAF2 | 1.5584098 | 70.121 | |
| 6 | 0 | | −50 | CAF2 | −1.5584098 | 74.489 | BSC reflecting surface |
| 7 | 0 | | −406.211301 | | −1 | 75.339 | |
| 8 | 309.214616 | | −11.5 | CAF2 | −1.5584098 | 108.103 | |
| 9 | 5284.11887 | | −29.7080002 | | −1 | 113.668 | |
| 10 | 262.399253 | | −12.5 | CAF2 | −1.5584098 | 114.929 | |
| 11 | 842.345508 | AS | −29.8064246 | | −1 | 124.8 | |
| 12 | 257.306004 | | 29.8064246 | | −1 | 127.885 | Concave mirror |
| 13 | 842.345508 | AS | 12.5 | CAF2 | 1.5584098 | 123.131 | |
| 14 | 262.399253 | | 29.7080002 | | 1 | 110.077 | |
| 15 | 5284.11887 | | 11.5 | CAF2 | 1.5584098 | 106.597 | |
| 16 | 309.214616 | | 406.211301 | | 1 | 100.38 | |
| 17 | 0 | | 50 | CAF2 | 1.5584098 | 62.656 | |
| 18 | 0 | | 50 | CAF2 | 1.5584098 | 61.538 | BSC entry surface |
| 19 | 0 | | 4.99981362 | | 1 | 56.8 | |
| 20 | 352.193263 | | 13.6846692 | CAF2 | 1.5584098 | 55.947 | |
| 21 | −7219.79266 | | 198.998488 | | 1 | 54.91 | |
| 22 | 0 | | −78.3243428 | | −1 | 110.383 | Deflecting mirror |
| 23 | −265.53614 | | −51.89466 | CAF2 | −1.5584098 | 118.441 | |
| 24 | 671.546195 | | −21.1104442 | | −1 | 117.797 | |
| 25 | −328.403608 | | −29.4824766 | CAF2 | −1.5584098 | 108.863 | |
| 26 | 20985.0561 | | −17.081681 | | −1 | 106.32 | |
| 27 | 408.33753 | | −10 | CAF2 | −1.5584098 | 104.888 | |
| 28 | −320.597758 | AS | −42.7289637 | | −1 | 99.662 | |
| 29 | −163.612925 | | −15 | CAF2 | −1.5584098 | 98.737 | |
| 30 | −133.401003 | | −192.185202 | | −1 | 93.434 | |
| 31 | −661.250408 | AS | −24.4771262 | CAF2 | −1.5584098 | 110.614 | |
| 32 | 1400.56504 | | −5.14399888 | | −1 | 110.635 | |
| 33 | −576.607436 | | −20.0867201 | CAF2 | −1.5584098 | 109.807 | |
| 34 | −10238.6915 | | −1.00143065 | | −1 | 108.841 | |
| 35 | −391.155057 | | −13 | CAF2 | −1.5584098 | 106.65 | |
| 36 | −153.692699 | | −21.2818355 | | −1 | 99.884 | |
| 37 | −241.974387 | | −32.5943881 | CAF2 | −1.5584098 | 101.011 | |
| 38 | −7533.68955 | | −12.0511708 | | −1 | 100.357 | |
| 39 | −165.09887 | | −36.9993124 | CAF2 | −1.5584098 | 96.778 | |
| 40 | −717.184237 | | −14.374126 | | −1 | 93.29 | |
| 41 | 0 | | −11.0867942 | | −1 | 90 | Aperture stop |
| 42 | 1999.38636 | AS | −10 | CAF2 | −1.5584098 | 88.453 | |
| 43 | −183.563743 | | −28.6894623 | | −1 | 85.346 | |
| 44 | −10343.5384 | | −32.1011472 | CAF2 | −1.5584098 | 86.611 | |
| 45 | 242.796866 | | −0.99985104 | | −1 | 88.094 | |
| 46 | −141.008981 | | −54.4544334 | CAF2 | −1.5584098 | 85.149 | |
| 47 | −1068.73543 | AS | −5.06814455 | | −1 | 76.827 | |
| 48 | −98.985445 | | −47.8700561 | CAF2 | −1.5584098 | 65.031 | |
| 49 | −187.562502 | AS | −1.48761752 | | −1 | 47.758 | |
| 50 | −131.529486 | | −29.9998809 | CAF2 | −1.5584098 | 45.327 | |
| 51 | 5286.47237 | AS | −1.1030213 | | −1 | 31.761 | |
| 52 | 0 | | −10 | CAF2 | −1.5584098 | 30.321 | |
| 53 | 0 | | −8 | | −1 | 24.291 | |
| 54 | 0 | | 0 | | −1 | 13.463 | Wafer |

TABLE 4

Asphericity Constants

Surface No. 4

| | |
|---|---|
| K | 0.00000000E+00 |
| C1 | 1.35111881E−08 |
| C2 | 7.34681503E−14 |
| C3 | 1.95870959E−18 |
| C4 | 9.89975829E−24 |
| C5 | −7.02333698E−26 |
| C6 | 0.00000000E+00 |

TABLE 4-continued

Asphericity Constants

| | |
|---|---|
| C7 | 0.00000000E+00 |
| C8 | 0.00000000E+00 |
| C9 | 0.00000000E+00 |

Surface No. 11

| | |
|---|---|
| K | 0.00000000E+00 |
| C1 | 8.50589208E−09 |
| C2 | −7.80175948E−14 |
| C3 | 2.46202626E−18 |

TABLE 4-continued

Asphericity Constants

| | |
|---|---|
| C4 | −4.10885604E−23 |
| C5 | 9.25866796E−28 |
| C6 | 0.00000000E+00 |
| C7 | 0.00000000E+00 |
| C8 | 0.00000000E+00 |
| C9 | 0.00000000E+00 |
| Surface No. 13 | |
| K | 0.00000000E+00 |
| C1 | 8.50589208E−09 |
| C2 | −7.80175948E−14 |
| C3 | 2.46202626E−18 |
| C4 | −4.10885604E−23 |
| C5 | 9.25866796E−28 |
| C6 | 0.00000000E+00 |
| C7 | 0.00000000E+00 |
| C8 | 0.00000000E+00 |
| C9 | 0.00000000E+00 |
| Surface No. 28 | |
| K | 0.00000000E+00 |
| C1 | −6.70030705E−09 |
| C2 | 1.11723923E−13 |
| C3 | 6.44584551E−18 |
| C4 | 2.18805698E−23 |
| C5 | 1.19347613E−26 |
| C6 | 0.00000000E+00 |
| C7 | 0.00000000E+00 |
| C8 | 0.00000000E+00 |
| C9 | 0.00000000E+00 |
| Surface No. 31 | |
| K | 0.00000000E+00 |
| C1 | 1.35154352E−09 |
| C2 | −1.52293143E−13 |
| C3 | −8.28438403E−19 |
| C4 | −3.54333855E−23 |
| C5 | −3.23740835E−27 |
| C6 | 0.00000000E+00 |
| C7 | 0.00000000E+00 |
| C8 | 0.00000000E+00 |
| C9 | 0.00000000E+00 |
| Surface No. 42 | |
| K | 0.00000000E+00 |
| C1 | 2.87049613E−08 |
| C2 | −1.03867207E−12 |
| C3 | 1.03128306E−17 |
| C4 | −1.39631135E−21 |
| C5 | 1.03923291E−25 |
| C6 | 0.00000000E+00 |

TABLE 4-continued

Asphericity Constants

| | |
|---|---|
| C7 | 0.00000000E+00 |
| C8 | 0.00000000E+00 |
| C9 | 0.00000000E+00 |
| Surface No. 47 | |
| K | 0.00000000E+00 |
| C1 | 1.95783990E−08 |
| C2 | −9.62681014E−13 |
| C3 | −1.42156765E−16 |
| C4 | 5.05778442E−21 |
| C5 | −3.99717591E−25 |
| C6 | 0.00000000E+00 |
| C7 | 0.00000000E+00 |
| C8 | 0.00000000E+00 |
| C9 | 0.00000000E+00 |
| Surface No. 49 | |
| K | 0.00000000E+00 |
| C1 | 1.95783990E−08 |
| C2 | −9.62681014E−13 |
| C3 | −1.42156765E−16 |
| C4 | 5.05778442E−21 |
| C5 | −3.99717591E−25 |
| C6 | 0.00000000E+00 |
| C7 | 0.00000000E+00 |
| C8 | 0.00000000E+00 |
| C9 | 0.00000000E+00 |
| Surface No. 51 | |
| K | 0.00000000E+00 |
| C1 | −1.13795121E−07 |
| C2 | −3.18085962E−11 |
| C3 | −8.97407796E−16 |
| C4 | 2.82851591E−18 |
| C5 | −1.86773983E−21 |
| C6 | 0.00000000E+00 |
| C7 | 0.00000000E+00 |
| C8 | 0.00000000E+00 |
| C9 | 0.00000000E+00 |

TABLE 5

| Surface No. | Radius [mm] | Aspherical | Thickness/ Spacing [mm] | Substrate Material | Refractive Index at 157.63 nm | One-Half Clear Diameter [mm] | |
|---|---|---|---|---|---|---|---|
| 0 | 0 | | 38 | | 1 | 53.852 | Reticle |
| 1 | 0 | | 10 | CAF2 | 1.5584098 | 61.454 | |
| 2 | 0 | | 24.9998271 | | 1 | 62.728 | |
| 3 | 297.18673 | | 17 | CAF2 | 1.5584098 | 69.424 | |
| 4 | 3760.17196 | AS | 105 | | 1 | 69.796 | |
| 5 | 0 | | 50 | CAF2 | 1.5584098 | 70.121 | |
| 6 | 0 | | −50 | CAF2 | −1.5584098 | 74.489 | BSC reflecting surface |
| 7 | 0 | | −306.211301 | | −1 | 75.339 | |
| 8 | 309.214616 | | −11.5 | CAF2 | −1.5584098 | 108.103 | |
| 9 | 5284.11887 | | −29.7080002 | | −1 | 113.668 | |
| 10 | 262.399253 | | −12.5 | CAF2 | −1.5584098 | 114.929 | |
| 11 | 842.345508 | AS | −29.8064246 | | −1 | 124.8 | |
| 12 | 257.306004 | | 29.8064246 | | | 127.885 | Concave mirror |
| 13 | 842.345508 | AS | 12.5 | CAF2 | 1.5584098 | 123.131 | |

TABLE 5-continued

| Surface No. | Radius [mm] | Aspherical | Thickness/Spacing [mm] | Substrate Material | Refractive Index at 157.63 nm | One-Half Clear Diameter [mm] | |
|---|---|---|---|---|---|---|---|
| 14 | 262.399253 | | 29.7080002 | | 1 | 110.077 | |
| 15 | 5284.11887 | | 11.5 | CAF2 | 1.5584098 | 106.597 | |
| 16 | 309.214616 | | 306.211301 | | 1 | 100.38 | |
| 17 | 0 | | 50 | CAF2 | 1.5584098 | 62.656 | |
| 18 | 0 | | 50 | CAF2 | 1.5584098 | 61.538 | BSC entry surface |
| 19 | 0 | | 104.999814 | | 1 | 56.8 | |
| 20 | 352.193263 | | 13.6846692 | CAF2 | 1.5584098 | 55.947 | |
| 21 | −7219.79266 | | 108.998488 | | 1 | 54.91 | |
| 22 | 0 | | −168.324343 | | −1 | 110.383 | Deflecting mirror |
| 23 | −265.53614 | | −51.89466 | CAF2 | −1.5584098 | 118.441 | |
| 24 | 671.546195 | | −21.1104442 | | −1 | 117.797 | |
| 25 | −328.403608 | | −29.4824766 | CAF2 | −1.5584098 | 108.863 | |
| 26 | 20985.0561 | | −17.081681 | | −1 | 106.32 | |
| 27 | 408.33753 | | −10 | CAF2 | −1.5584098 | 104.888 | |
| 28 | −320.597753 | AS | −42.7289637 | | −1 | 99.662 | |
| 29 | −163.612925 | | −15 | CAF2 | −1.5584098 | 98.737 | |
| 30 | −133.401003 | | −192.185202 | | −1 | 93.434 | |
| 31 | −661.250408 | AS | −24.4771262 | CAF2 | −1.5584098 | 110.614 | |
| 32 | 1400.56504 | | −5.14399888 | | −1 | 110.635 | |
| 33 | −576.607436 | | −20.0867201 | CAF2 | −1.5584098 | 109.807 | |
| 34 | −10238.6915 | | −1.00143065 | | −1 | 108.841 | |
| 35 | −391.155057 | | −13 | CAF2 | −1.5584098 | 106.65 | |
| 36 | −153.692699 | | −21.2818355 | | −1 | 99.884 | |
| 37 | −241.974387 | | −32.5943881 | CAF2 | −1.5584098 | 101.011 | |
| 38 | −7533.68955 | | −12.0511708 | | −1 | 100.357 | |
| 39 | −165.09887 | | −36.9993124 | CAF2 | −1.5584098 | 96.778 | |
| 40 | −717.184237 | | −14.374126 | | −1 | 93.29 | |
| 41 | 0 | | −11.0867942 | | −1 | 90 | Aperture stop |
| 42 | 1999.38636 | AS | −10 | CAF2 | −1.5584098 | 88.453 | |
| 43 | −183.563743 | | −28.6894623 | | −1 | 85.346 | |
| 44 | −10343.5384 | | −32.1011472 | CAF2 | −1.5584098 | 86.611 | |
| 45 | 242.796866 | | −0.99985104 | | −1 | 88.094 | |
| 46 | −141.008981 | | −54.4544334 | CAF2 | −1.5584098 | 85.149 | |
| 47 | −1068.73543 | AS | −5.06814455 | | −1 | 76.827 | |
| 48 | −98.985445 | | −47.8700561 | CAF2 | −1.5584098 | 65.031 | |
| 49 | −187.562502 | AS | −1.48761752 | | −1 | 47.758 | |
| 50 | −131.529486 | | −29.9998809 | CAF2 | −1.5584098 | 45.327 | |
| 51 | 5286.47237 | AS | −1.1030213 | | −1 | 31.761 | |
| 52 | 0 | | −10 | CAF2 | −1.5584098 | 30.321 | |
| 53 | 0 | | −8 | | −1 | 24.291 | |
| 54 | 0 | | 0 | | −1 | 13.463 | Wafer |

TABLE 6

Asphericity Constants

Surface No. 4

| K | 0.00000000E+00 |
|---|---|
| C1 | 1.35111881E−08 |
| C2 | 7.34681503E−14 |
| C3 | 1.95870959E−18 |
| C4 | 9.89975829E−24 |
| C5 | −7.02333698E−26 |
| C6 | 0.00000000E+00 |
| C7 | 0.00000000E+00 |
| C8 | 0.00000000E+00 |
| C9 | 0.00000000E+00 |

Surface No. 11

| K | 0.00000000E+00 |
|---|---|
| C1 | 8.50589208E−09 |
| C2 | −7.80175948E−14 |
| C3 | 2.46202626E−18 |
| C4 | −4.10885604E−23 |
| C5 | 9.25866796E−28 |
| C6 | 0.00000000E+00 |
| C7 | 0.00000000E+00 |
| C8 | 0.00000000E+00 |
| C9 | 0.00000000E+00 |

TABLE 6-continued

Asphericity Constants

Surface No. 13

| K | 0.00000000E+00 |
|---|---|
| C1 | 8.50589208E−09 |
| C2 | −7.80175948E−14 |
| C3 | 2.46202626E−18 |
| C4 | −4.10885604E−23 |
| C5 | 9.25866796E−28 |
| C6 | 0.00000000E+00 |
| C7 | 0.00000000E+00 |
| C8 | 0.00000000E+00 |
| C9 | 0.00000000E+00 |

Surface No. 28

| K | 0.00000000E+00 |
|---|---|
| C1 | −6.70030705E−09 |
| C2 | 1.11723923E−13 |
| C3 | 6.44584551E−18 |
| C4 | 2.18805698E−23 |
| C5 | 1.19347613E−26 |
| C6 | 0.00000000E+00 |
| C7 | 0.00000000E+00 |
| C8 | 0.00000000E+00 |
| C9 | 0.00000000E+00 |

TABLE 6-continued

Asphericity Constants

Surface No. 31

| | |
|---|---|
| K | 0.00000000E+00 |
| C1 | 1.35154352E−09 |
| C2 | −1.52293143E−13 |
| C3 | −8.28438403E−19 |
| C4 | −3.54133855E−23 |
| C5 | −3.23740835E−27 |
| C6 | 0.00000000E+00 |
| C7 | 0.00000000E+00 |
| C8 | 0.00000000E+00 |
| C9 | 0.00000000E+00 |

Surface No. 42

| | |
|---|---|
| K | 0.00000000E+00 |
| C1 | 2.87049613E−08 |
| C2 | −1.03867207E−12 |
| C3 | 1.03128306E−17 |
| C4 | −1.39631135E−21 |
| C5 | 1.03923291E−25 |
| C6 | 0.00000000E+00 |
| C7 | 0.00000000E+00 |
| C8 | 0.00000000E+00 |
| C9 | 0.00000000E+00 |

Surface No. 47

| | |
|---|---|
| K | 0.00000000E+00 |
| C1 | 1.95783990E−08 |
| C2 | −9.62681014E−13 |
| C3 | −1.42156765E−16 |

TABLE 6-continued

Asphericity Constants

| | |
|---|---|
| C4 | 5.05778442E−21 |
| C5 | −3.99717591E−25 |
| C6 | 0.00000000E+00 |
| C7 | 0.00000000E+00 |
| C8 | 0.00000000E+00 |
| C9 | 0.00000000E+00 |

Surface No. 49

| | |
|---|---|
| K | 0.00000000E+00 |
| C1 | 1.95783990E−08 |
| C2 | −9.62681014E−13 |
| C3 | −1.42156765E−16 |
| C4 | 5.05778442E−21 |
| C5 | −3.99717591E−25 |
| C6 | 0.00000000E+00 |
| C7 | 0.00000000E+00 |
| C8 | 0.00000000E+00 |
| C9 | 0.00000000E+00 |

Surface No. 51

| | |
|---|---|
| K | 0.00000000E+00 |
| C1 | −1.13795121E−07 |
| C2 | −3.18085962E−11 |
| C3 | −8.97407796E−16 |
| C4 | 2.82851591E−18 |
| C5 | −1.86773983E−21 |
| C6 | 0.00000000E+00 |
| C7 | 0.00000000E+00 |
| C8 | 0.00000000E+00 |
| C9 | 0.00000000E+00 |

TABLE 7

| Surface No. | Radius [mm] | Aspherical | Thickness/ Spacing [mm] | Substrate Material | Refractive Index at 157.63 nm | One-Half Clear Diameter [mm] | |
|---|---|---|---|---|---|---|---|
| 0 | 0 | | 38 | | 1 | 53.852 | Reticle |
| 1 | 0 | | 10 | CAF2 | 1.5584098 | 61.454 | |
| 2 | 0 | | 24.9998271 | | 1 | 62.728 | |
| 3 | 297.18673 | | 17 | CAF2 | 1.5584098 | 69.424 | |
| 4 | 3760.17196 | AS | 125 | | 1 | 69.796 | |
| 5 | 0 | | 50 | CAF2 | 1.5584098 | 70.121 | |
| 6 | 0 | | −50 | CAF2 | −1.5584098 | 74.489 | BSC reflecting surface |
| 7 | 0 | | −286.211301 | | −1 | 75.339 | |
| 8 | 309.214616 | | −11.5 | CAF2 | −1.5584098 | 108.103 | |
| 9 | 5284.11887 | | −29.7080002 | | −1 | 113.668 | |
| 10 | 262.399253 | | −12.5 | CAF2 | −1.5584098 | 114.929 | |
| 11 | 842.345508 | AS | −29.8064246 | | −1 | 124.8 | |
| 12 | 257.306004 | | 29.8064246 | | | 127.885 | Concave mirror |
| 13 | 842.345508 | AS | 12.5 | CAF2 | 1.5584098 | 123.131 | |
| 14 | 262.399253 | | 29.7080002 | | 1 | 110.077 | |
| 15 | 5284.11887 | | 11.5 | CAF2 | 1.5584098 | 106.597 | |
| 16 | 309.214616 | | 286.211301 | | 1 | 100.38 | |
| 17 | 0 | | 50 | CAF2 | 1.5584098 | 62.656 | |
| 18 | 0 | | 50 | CAF2 | 1.5584098 | 61.538 | BSC entry surface |
| 19 | 0 | | 74.9998136 | | 1 | 56.8 | |
| 22 | 0 | | −50 | | −1 | 110.383 | Deflecting mirror |
| 20 | −352.193263 | | −13.6846692 | CAF2 | −1.5584098 | 55.947 | |
| 21 | 7219.79266 | | −276.998488 | | −1 | 54.91 | |
| 23 | −265.53614 | | −51.89466 | CAF2 | −1.5584098 | 118.441 | |
| 24 | 671.548195 | | −21.1104442 | | −1 | 117.797 | |

TABLE 7-continued

| Surface No. | Radius [mm] | Aspherical | Thickness/ Spacing [mm] | Substrate Material | Refractive Index at 157.63 nm | One-Half Clear Diameter [mm] | |
|---|---|---|---|---|---|---|---|
| 25 | −328.403608 | | −29.4824766 | CAF2 | −1.5584098 | 108.863 | |
| 26 | 20985.0561 | | −17.081681 | | −1 | 106.32 | |
| 27 | 408.33753 | | −10 | CAF2 | −1.5584098 | 104.888 | |
| 28 | −320.597753 | AS | −42.7289637 | | −1 | 99.662 | |
| 29 | −163.612925 | | −15 | CAF2 | −1.5584098 | 98.737 | |
| 30 | −133.401003 | | −192.185202 | | −1 | 93.434 | |
| 31 | −661.250408 | AS | −24.4771262 | CAF2 | −1.5584098 | 110.614 | |
| 32 | 1400.56504 | | −5.14399888 | | −1 | 110.635 | |
| 33 | −576.607436 | | −20.0867201 | CAF2 | −1.5584098 | 109.807 | |
| 34 | −10238.6915 | | −1.00143065 | | −1 | 108.841 | |
| 35 | −391.155057 | | −13 | CAF2 | −1.5584098 | 106.65 | |
| 36 | −153.692699 | | −21.2818355 | | −1 | 99.884 | |
| 37 | −241.974387 | | −32.5943881 | CAF2 | −1.5584098 | 101.011 | |
| 38 | −7533.68955 | | −12.0511708 | | −1 | 100.357 | |
| 39 | −165.09887 | | −36.9993124 | CAF2 | −1.5584098 | 96.778 | |
| 40 | −717.184237 | | −14.374126 | | −1 | 93.29 | |
| 41 | 0 | | −11.0867942 | | −1 | 90 | Aperture stop |
| 42 | 1999.38636 | AS | −10 | CAF2 | −1.5584098 | 88.453 | |
| 43 | −183.563743 | | −28.6894623 | | −1 | 85.346 | |
| 44 | −10343.5384 | | −32.1011472 | CAF2 | −1.5584098 | 86.611 | |
| 45 | 242.796866 | | −0.99985104 | | −1 | 88.094 | |
| 46 | −141.008981 | | −54.4544334 | CAF2 | −1.5584098 | 85.149 | |
| 47 | −1068.73543 | AS | −5.06814455 | | −1 | 76.827 | |
| 48 | −98.985445 | | −47.8700561 | CAF2 | −1.5584098 | 65.031 | |
| 49 | −187.562502 | AS | −1.48761752 | | −1 | 47.758 | |
| 50 | −131.529486 | | −29.9998809 | CAF2 | −1.5584098 | 45.327 | |
| 51 | 5286.47237 | AS | −1.1030213 | | −1 | 31.761 | |
| 52 | 0 | | −10 | CAF2 | −1.5584098 | 30.321 | |
| 53 | 0 | | −8 | | −1 | 24.291 | |
| 54 | 0 | | 0 | | −1 | 13.463 | Wafer |

TABLE 8

Asphericity Constants

Surface No. 4

| K | 0.00000000E+00 |
|---|---|
| C1 | 1.35111881E−08 |
| C2 | 7.34681503E−14 |
| C3 | 1.95870959E−18 |
| C4 | 9.89975829E−24 |
| C5 | −7.02333698E−26 |
| C6 | 0.00000000E+00 |
| C7 | 0.00000000E+00 |
| C8 | 0.00000000E+00 |
| C9 | 0.00000000E+00 |

Surface No. 11

| K | 0.00000000E+00 |
|---|---|
| C1 | 8.50589208E−09 |
| C2 | −7.80175948E−14 |
| C3 | 2.46202626E−18 |
| C4 | −4.10885604E−23 |
| C5 | 9.25866796E−28 |
| C6 | 0.00000000E+00 |
| C7 | 0.00000000E+00 |
| C8 | 0.00000000E+00 |
| C9 | 0.00000000E+00 |

Surface No. 13

| K | 0.00000000E+00 |
|---|---|
| C1 | 8.50589208E−09 |
| C2 | −7.80175948E−14 |
| C3 | 2.46202626E−18 |
| C4 | −4.10885604E−23 |
| C5 | 9.25866796E−28 |
| C6 | 0.00000000E+00 |
| C7 | 0.00000000E+00 |
| C8 | 0.00000000E+00 |

TABLE 8-continued

Asphericity Constants

| C9 | 0.00000000E+00 |
|---|---|

Surface No. 28

| K | 0.00000000E+00 |
|---|---|
| C1 | −6.70030705E−09 |
| C2 | 1.11723923E−13 |
| C3 | 6.44584551E−18 |
| C4 | 2.18805698E−23 |
| C5 | 1.19347613E−26 |
| C6 | 0.00000000E+00 |
| C7 | 0.00000000E+00 |
| C8 | 0.00000000E+00 |
| C9 | 0.00000000E+00 |

Surface No. 31

| K | 0.00000000E+00 |
|---|---|
| C1 | 1.35154352E−09 |
| C2 | −1.52293143E−13 |
| C3 | −8.28438403E−19 |
| C4 | −3.54133855E−23 |
| C5 | −3.23740835E−27 |
| C6 | 0.00000000E+00 |
| C7 | 0.00000000E+00 |
| C8 | 0.00000000E+00 |
| C9 | 0.00000000E+00 |

Surface No. 42

| K | 0.00000000E+00 |
|---|---|
| C1 | 2.87049613E−08 |
| C2 | −1.03867207E−12 |
| C3 | 1.03128306E−17 |
| C4 | −1.39631135E−21 |
| C5 | 1.03923291E−25 |
| C6 | 0.00000000E+00 |
| C7 | 0.00000000E+00 |

TABLE 8-continued

Asphericity Constants

| | |
|---|---|
| C8 | 0.00000000E+00 |
| C9 | 0.00000000E+00 |
| Surface No. 47 | |
| K | 0.00000000E+00 |
| C1 | 1.95783990E-08 |
| C2 | -9.62681014E-13 |
| C3 | -1.42156765E-16 |
| C4 | 5.05778442E-21 |
| C5 | -3.99717591E-25 |
| C6 | 0.00000000E+00 |
| C7 | 0.00000000E+00 |
| C8 | 0.00000000E+00 |
| C9 | 0.00000000E+00 |
| Surface No. 49 | |
| K | 0.00000000E+00 |
| C1 | 1.95783990E-08 |
| C2 | -9.62681014E-13 |
| C3 | -1.42156765E-16 |
| C4 | 5.05778442E-21 |

TABLE 8-continued

Asphericity Constants

| | |
|---|---|
| C5 | -3.99717591E-25 |
| C6 | 0.00000000E+00 |
| C7 | 0.00000000E+00 |
| C8 | 0.00000000E+00 |
| C9 | 0.00000000E+00 |
| Surface No. 51 | |
| K | 0.00000000E+00 |
| C1 | -1.13795121E-07 |
| C2 | -3.18085962E-11 |
| C3 | -8.97407796E-16 |
| C4 | 2.82851591E-18 |
| C5 | -1.86773983E-21 |
| C6 | 0.00000000E+00 |
| C7 | 0.00000000E+00 |
| C8 | 0.00000000E+00 |
| C9 | 0.00000000E+00 |

TABLE 9

| Surface No. | Radius [mm] | Aspherical | Thickness/ Spacing [mm] | Substrate Material | Refractive Index at 157.63 nm | One-Half Clear Diameter [mm] | |
|---|---|---|---|---|---|---|---|
| 0 | 0 | | 36 | | 1 | 53.857 | Reticle |
| 1 | 0 | | 10 | CAF2HL | 1.55840983 | 61.45 | |
| 2 | 0 | | 60 | | 1 | 62.79 | |
| 3 | 0 | | 50 | CAF2HL | 1.55840983 | 75.565 | |
| 4 | 0 | | -50 | CAF2HL | -1.55840983 | 87.769 | BSC reflecting surface |
| 5 | 0 | | -5 | | -1 | 89.127 | |
| 6 | -332.58543 | | -22.3583259 | CAF2HL | -1.55840983 | 93.056 | |
| 7 | -22454.8684 | | -450.835057 | | -1 | 93.299 | |
| 8 | 286.59349 | | -15 | CAF2HL | -1.55840983 | 112.68 | |
| 9 | 1215.99013 | AS | -32.4762714 | | -1 | 118.237 | |
| 10 | 222.86479 | | -15 | CAF2HL | -1.55840983 | 119.275 | |
| 11 | 788.820186 | | -32.0529617 | | -1 | 132.657 | |
| 12 | 259.09315 | | 32.0529617 | | 1 | 135.085 | Concave mirror |
| 13 | 788.820186 | | 15 | CAF2HL | 1.55840983 | 131.131 | |
| 14 | 222.86479 | | 32.4762714 | | 1 | 113.037 | |
| 15 | 1215.99013 | AS | 15 | CAF2HL | 1.55840983 | 109.317 | |
| 16 | 286.59349 | | 450.835055 | | 1 | 101.479 | |
| 17 | -22454.8684 | | 22.3583259 | CAF2HL | 1.55840983 | 55.882 | |
| 18 | -332.58543 | | 5 | | 1 | 54.766 | |
| 19 | 0 | | 50 | CAF2HL | 1.55840983 | 52.894 | |
| 20 | 0 | | 50 | CAF2HL | 1.55840983 | 60.391 | BSC entry surface |
| 21 | 0 | | 70 | | 1 | 63.982 | |
| 22 | 0 | | -60 | | -1 | 91.779 | Deflecting mirror |
| 23 | -246.798658 | | -25.384365 | CAF2HL | -1.55840983 | 100.137 | |
| 24 | -835.592238 | AS | -33.6631832 | | -1 | 99.951 | |
| 25 | 440.218287 | | -18.008250 | CAF2HL | -1.55840983 | 100.824 | |
| 26 | 423.205967 | | -79.9067472 | | -1 | 102.875 | |
| 27 | -567.883746 | | -30.05 | CAF2HL | -1.55840983 | 107.974 | |
| 28 | -321.681993 | AS | -18.1933939 | | -1 | 106.513 | |
| 29 | -904.592152 | | -23.3244222 | CAF2HL | -1.55840983 | 107.423 | |
| 30 | 763.411474 | | -245.513171 | | -1 | 108.029 | |
| 31 | -565.688258 | AS | -30.05 | CAF2HL | -1.55840983 | 114.229 | |
| 32 | -193.227636 | | -12.2512368 | | -1 | 111.231 | |
| 33 | -241.997278 | | -38.6061659 | CAF2HL | -1.55840983 | 113.134 | |
| 34 | 4544.07315 | | -14.2984402 | | -1 | 113.256 | |
| 35 | -296.820934 | AS | -17.5884258 | CAF2HL | -1.55840983 | 113.518 | |
| 36 | -175.336055 | | -27.2650443 | | -1 | 109.168 | |
| 37 | -237.489172 | | -38.4115826 | CAF2HL | -1.55840983 | 114.326 | |
| 38 | 49242.8835 | | -22.8600569 | | -1 | 113.996 | |
| 39 | 0 | | 8.96284367 | | -1 | 112.673 | Aperture stop |
| 40 | -253.223278 | | -57.4530826 | CAF2HL | -1.55840983 | 114.279 | |

TABLE 9-continued

| Surface No. | Radius [mm] | Aspherical | Thickness/ Spacing [mm] | Substrate Material | Refractive Index at 157.63 nm | One-Half Clear Diameter [mm] | |
|---|---|---|---|---|---|---|---|
| 41 | 314.497244 | | −7.27683613 | | −1 | 113.151 | |
| 42 | 333.502401 | AS | −18.5574246 | CAF2HL | −1.55840983 | 108.787 | |
| 43 | −167.175913 | | −18.1862897 | | −1 | 99.815 | |
| 44 | −240.395345 | | −51.0585724 | CAF2HL | −1.55840983 | 101.645 | |
| 45 | 324.77248 | | −1.3 | | −1 | 101.321 | |
| 46 | −144.34532 | | −36.8561013 | CAF2HL | −1.55840983 | 89.644 | |
| 47 | −454.324516 | | −1.3 | | −1 | 84.005 | |
| 48 | −214.719835 | | −36.7468454 | CAF2HL | −1.55840983 | 79.125 | |
| 49 | −973.887507 | | −1.3 | | −1 | 67.057 | |
| 50 | −169.387388 | AS | −48.9110178 | CAF2HL | −1.55840983 | 59.47 | |
| 51 | 1128.5309 | | −1.2 | | −1 | 35.423 | |
| 52 | 0 | | −10 | CAF2HL | −1.55840983 | 32.604 | |
| 53 | 0 | | −8 | | −1 | 26.144 | Wafer |

TABLE 10

Asphericity Constants

Surface No. 9

| | |
|---|---|
| K | 0.00000000E+00 |
| C1 | 1.04640884E−08 |
| C2 | −2.57475601E−13 |
| C3 | 3.06797772E−18 |
| C4 | 1.94870443E−23 |
| C5 | −7.46385558E−27 |
| C6 | 0.00000000E+00 |
| C7 | 0.00000000E+00 |
| C8 | 0.00000000E+00 |
| C9 | 0.00000000E+00 |

Surface No. 15

| | |
|---|---|
| K | 0.00000000E+00 |
| C1 | 1.04640884E−08 |
| C2 | −2.57475601E−13 |
| C3 | 3.06797772E−18 |
| C4 | 1.94870443E−23 |
| C5 | −7.46385558E−27 |
| C6 | 0.00000000E+00 |
| C7 | 0.00000000E+00 |
| C8 | 0.00000000E+00 |
| C9 | 0.00000000E+00 |

Surface No. 24

| | |
|---|---|
| K | 0.00000000E+00 |
| C1 | −7.13990574E−09 |
| C2 | −1.35264655E−14 |
| C3 | 6.48624293E−19 |
| C4 | −5.62509028E−231 |
| C5 | 2.59652460E−27 |
| C6 | 0.00000000E+00 |
| C7 | 0.00000000E+00 |
| C8 | 0.00000000E+00 |
| C9 | 0.00000000E+00 |

Surface No. 28

| | |
|---|---|
| K | 0.00000000E+00 |
| C1 | −7.95254514E−09 |
| C2 | −7.80452867E−14 |
| C3 | −2.43223099E−18 |
| C4 | 4.92409344E−23 |
| C5 | −4.19810623E−27 |
| C6 | 0.00000000E+00 |
| C7 | 0.00000000E+00 |
| C8 | 0.00000000E+00 |
| C9 | 0.00000000E+00 |

Surface No. 31

| | |
|---|---|
| K | 0.00000000E+00 |
| C1 | 4.10975771E−09 |
| C2 | −2.73153196E−13 |
| C3 | 7.14198196E−18 |
| C4 | −1.61807189E−22 |
| C5 | 9.86703826E−27 |
| C6 | 0.00000000E+00 |
| C7 | 0.00000000E+00 |
| C8 | 0.00000000E+00 |
| C9 | 0.00000000E+00 |

Surface No. 35

| | |
|---|---|
| K | 0.00000000E+00 |
| C1 | 7.00310825E−09 |
| C2 | 1.20244435E−13 |
| C3 | −3.51580138E−18 |
| C4 | 3.42245084E−22 |
| C5 | −3.11947273E−26 |
| C6 | 0.00000000E+00 |
| C7 | 0.00000000E+00 |
| C8 | 0.00000000E+00 |
| C9 | 0.00000000E+00 |

Surface No. 42

| | |
|---|---|
| K | 0.00000000E+00 |
| C1 | 1.80096458E−08 |
| C2 | −1.33625616E−12 |
| C3 | 6.82498346E−17 |
| C4 | −2.64540518E−21 |
| C5 | 7.09932519E−26 |
| C6 | 0.00000000E+00 |
| C7 | 0.00000000E+00 |
| C8 | 0.00000000E+00 |
| C9 | 0.00000000E+00 |

Surface No. 50

| | |
|---|---|
| K | 0.00000000E+00 |
| C1 | 6.42495703E−08 |
| C2 | 5.84775613E−12 |
| C3 | 2.04866458E−16 |
| C4 | −3.87301369E−20 |
| C5 | 7.97241968E−25 |
| C6 | 0.00000000E+00 |
| C7 | 0.00000000E+00 |
| C8 | 0.00000000E+00 |
| C9 | 0.00000000E+00 |

TABLE 11

| Surface No. | Radius [mm] | Aspherical | Thickness/ Spacing [mm] | Substrate Material | Refractive Index at 157.63 nm | One-Half Clear Diameter [mm] | |
|---|---|---|---|---|---|---|---|
| 0 | 0 | | 36 | | 1 | 53.852 | Reticle |
| 1 | 500 | AS | 20.9022623 | CaF2 | 1.55840983 | 62.194 | |
| 2 | 942.110628 | | 223.450652 | | 1 | 64.205 | |
| 3 | −899.75786 | | 36.5636216 | CaF2 | 1.55840983 | 107.871 | |
| 4 | −201.504559 | | 25.8310778 | | 1 | 109.712 | |
| 5 | 0 | | 80.4999994 | CaF2 | 1.55840983 | 104.915 | |
| 6 | 0 | | 80.4999994 | CaF2 | 1.55840983 | 115.478 | BSC entry surface |
| 7 | 0 | | 20 | | 1 | 96.501 | |
| 8 | 861.89337 | | 18 | CaF2 | 1.55840983 | 94.46 | |
| 9 | 270.408127 | | 252.530915 | | 1 | 91.823 | |
| 10 | −244.834973 | | 17.6331217 | CaF2 | 1.55840983 | 114.577 | |
| 11 | −454.79723 | AS | 30.849701 | | 1 | 123.084 | |
| 12 | −198.295615 | | 17.2109705 | CaF2 | 1.55840983 | 124.654 | |
| 13 | −615.223277 | | 36.3919942 | | 1 | 145.597 | |
| 14 | −271.926611 | | −36.3919942 | | −1 | 150.807 | Concave mirror |
| 15 | −615.223277 | | −17.2109705 | CaF2 | −1.55840983 | 145.131 | |
| 16 | −198.295615 | | −30.849701 | | −1 | 123.847 | |
| 17 | −454.79723 | AS | −17.6331217 | CaF2 | −1.55840983 | 122.188 | |
| 18 | −244.834973 | | −252.530915 | | −1 | 113.502 | |
| 19 | 270.408127 | | −18 | CaF2 | −1.55840983 | 69.407 | |
| 20 | 861.89337 | | −20 | | −1 | 68.709 | |
| 21 | 0 | | −80.4999994 | CaF2 | −1.55840983 | 66.672 | |
| 22 | 0 | | 80.4999994 | CaF2 | 1.55840983 | 67.443 | BSC relecting surface |
| 23 | 0 | | 53.0684833 | | 1 | 57.67 | |
| 24 | 199.341566 | | 30.05 | CaF2 | 1.55840983 | 57.845 | |
| 25 | −460.337256 | | 46.9346794 | | 1 | 59.299 | |
| 26 | 138.728097 | | 14.7805722 | CaF2 | 1.55840983 | 63.099 | |
| 27 | 214.049483 | AS | 30.3336654 | | 1 | 61.795 | |
| 28 | −228.071928 | | 10.0576925 | CaF2 | 1.55840983 | 61.377 | |
| 29 | −282.013959 | | 1.05005134 | | 1 | 62.278 | |
| 30 | 130.608057 | | 10.05 | CaF2 | 1.55840983 | 62.199 | |
| 31 | 102.384771 | AS | 111.354418 | | 1 | 59.374 | |
| 32 | 0 | | −90.341693 | | −1 | 106.962 | Deflecting mirror |
| 33 | −5335.50209 | | −29.9910739 | CaF2 | −1.55840983 | 89.365 | |
| 34 | −364.00654 | AS | −4.47984172 | | −1 | 93.525 | |
| 35 | −425.724946 | | −10.1423482 | CaF2 | −1.55840983 | 94.51 | |
| 36 | −227.015939 | | −11.4682588 | | −1 | 97.295 | |
| 37 | −380.450726 | | −13.4218689 | CaF2 | −1.55840983 | 98.97 | |
| 38 | −565.293055 | | −1.05212894 | | −1 | 101.158 | |
| 39 | −250.68949 | | −28.7443866 | CaF2 | −1.55840983 | 110.44 | |
| 40 | −1017.76862 | | −1.38341955 | | −1 | 111.266 | |
| 41 | −294.869745 | AS | −10.4498071 | CaF2 | −1.55840983 | 114.723 | |
| 42 | −305.322567 | | −8.09949454 | | −1 | 114.582 | |
| 43 | −402.688007 | | −33.8748199 | CaF2 | −1.55840983 | 115.158 | |
| 44 | 846.633869 | | −1.91721131 | | −1 | 115.409 | |
| 45 | −241.9447717 | AS | −13.295215 | CaF2 | −1.5584098 | 114.13 | |
| 46 | −161.4522702 | | −32.660698 | | −1 | 108.786 | |
| 47 | −357.7106159 | | −41.590986 | CaF2 | −1.5584098 | 110.493 | |
| 48 | 414.7495535 | | 6.62988814 | | −1 | 110.61 | |
| 49 | 0 | | −20.039854 | | −1 | 109.449 | Aperture stop |
| 50 | −166.6967755 | | −54.126055 | CaF2 | −1.5584098 | 111.933 | |
| 51 | 3496.363023 | | −3.2925264 | | −1 | 109.372 | |
| 52 | 3595.9743 | AS | −14.802615 | CaF2 | −1.5584098 | 108.193 | |
| 53 | −127.853589 | | −11.844124 | | −1 | 92.487 | |
| 54 | −157.0415279 | | −45.397946 | CaF2 | −1.5584098 | 92.804 | |
| 55 | 720.1763338 | | −1.05 | | −1 | 91.137 | |
| 56 | −139.9326895 | | −25.677157 | CaF2 | −1.5584098 | 79.281 | |
| 57 | −298.1481689 | | −4.0674706 | | −1 | 74.262 | |
| 58 | −126.0408586 | | −24.656256 | CaF2 | −1.5584098 | 65.929 | |
| 59 | −104.4531004 | | −1.05 | | −1 | 53.139 | |
| 60 | −8.32323939E+01 | | −30.05 | CaF2 | −1.5584098 | 50.37 | |
| 61 | −6.13937265E+02 | | −1.3 | | −1 | 40.775 | |
| 62 | 0.00000000E+00 | | −10 | CaF2 | −1.5584098 | 40.865 | |
| 63 | 0.00000000E+00 | | −13.068912 | | −1 | 34.379 | |
| 64 | 0.00000000E+00 | | 0 | | −1 | 13.517 | Wafer |

TABLE 12

| Asphericity Constants | | |
|---|---|---|
| Surface No. 1 | | |
| K | 0.00000000E+00 | |
| C1 | −3.27121230E−08 | |
| C2 | −9.40293954E−13 | |
| C3 | −6.46294158E−17 | |
| C4 | 5.41087076E−20 | |
| C5 | −1.45068323E−23 | |
| C6 | 1.13364859E−27 | |
| C7 | 0.00000000E+00 | |
| C8 | 0.00000000E+00 | |
| C9 | 0.00000000E+00 | |
| Surface No. 11 | | |
| K | 0.00000000E+00 | |
| C1 | −5.14786871E−09 | |
| C2 | −2.95669959E−15 | |
| C3 | −2.68430622E−19 | |
| C4 | −1.75360329E−23 | |
| C5 | 1.64334844E−27 | |
| C6 | −6.22747280E−32 | |
| C7 | 0.00000000E+00 | |
| C8 | 0.00000000E+00 | |
| C9 | 0.00000000E+00 | |
| Surface No. 17 | | |
| K | 0.00000000E+00 | |
| C1 | −5.14788871E−09 | |
| C2 | −2.95669959E−15 | |
| C3 | −2.68430622E−19 | |
| C4 | −1.75360329E−23 | |
| C5 | 1.64334844E−27 | |
| C6 | −6.22747280E−32 | |
| C7 | 0.00000000E+00 | |
| C8 | 0.00000000E+00 | |
| C9 | 0.00000000E+00 | |
| Surface No. 27 | | |
| K | 0.00000000E+00 | |
| C1 | 1.12010970E−08 | |
| C2 | 4.37694006E−12 | |
| C3 | 1.81063824E−16 | |
| C4 | 2.28693260E−20 | |
| C5 | −1.22908745E−23 | |
| C6 | 1.68652804E−27 | |
| C7 | 0.00000000E+00 | |
| C8 | 0.00000000E+00 | |
| C9 | 0.00000000E+00 | |
| Surface No. 31 | | |
| K | 0.00000000E+00 | |
| C1 | 1.21384452E−07 | |
| C2 | 1.69072027E−12 | |
| C3 | 7.06425492E−17 | |
| C4 | 7.45238220E−20 | |
| C5 | −1.55367788E−24 | |
| C6 | −9.81276183E−28 | |
| C7 | 0.00000000E+00 | |
| C8 | 0.00000000E+00 | |
| C9 | 0.00000000E+00 | |
| Surface No. 34 | | |
| K | 0.00000000E+00 | |
| C1 | 1.15782783E−08 | |
| C2 | −9.78005205E−13 | |
| C3 | −7.61172073E−17 | |
| C4 | 1.61748639E−21 | |
| C5 | −8.49988131E−26 | |

TABLE 12-continued

| Asphericity Constants | |
|---|---|
| C6 | 6.32925552E−30 |
| C7 | 0.00000000E+00 |
| C8 | 0.00000000E+00 |
| C9 | 0.00000000E+00 |
| Surface No. 41 | |
| K | 0.00000000E+00 |
| C1 | 1.68564898E−08 |
| C2 | −2.00899666E−13 |
| C3 | −3.73478444E−17 |
| C4 | 9.37658342E−22 |
| C5 | 2.21428840E−26 |
| C6 | −5.65946446E−31 |
| C7 | 0.00000000E+00 |
| C8 | 0.00000000E+00 |
| C9 | 0.00000000E+00 |
| Surface No. 45 | |
| K | 0.00000000E+00 |
| C1 | 4.62840327E−09 |
| C2 | −1.92324724E−13 |
| C3 | 1.49626921E−17 |
| C4 | 2.56518858E−22 |
| C5 | −1.69609681E−26 |
| C6 | 9.83578362E−31 |
| C7 | 0.00000000E+00 |
| C8 | 0.00000000E+00 |
| C9 | 0.00000000E+00 |
| Surface No. 52 | |
| K | 0.00000000E+00 |
| C1 | 2.17984721E−08 |
| C2 | −1.50220782E−12 |
| C3 | 1.74597010E−17 |
| C4 | 2.86470208E−22 |
| C5 | −2.13811668E−26 |
| C6 | 7.86460145E−31 |
| C7 | 0.00000000E+00 |
| C8 | 0.00000000E+00 |
| C9 | 0.00000000E+00 |
| Surface No. 60 | |
| K | 0.00000000E+00 |
| C1 | −1.03654365E−07 |
| C2 | −6.76103470E−12 |
| C3 | −1.39274121E−15 |
| C4 | 3.27563718E−19 |
| C5 | −1.31757347E−22 |
| C6 | −1.87623563E−27 |
| C7 | 0.00000000E+00 |
| C8 | 0.00000000E+00 |
| C9 | 0.00000000E+00 |

TABLE 13

| Surface No. | Radius [mm] | Thickness/ Spacing [mm] | Substrate Material | Refractive Index at 157.63 nm | One-Half Clear Diameter [mm] | |
|---|---|---|---|---|---|---|
| 0 | 0 | 38 | | 1 | 53.151 | Rectile |
| 1 | 0 | 10 | CaF2 | 1.5584098 | 61.272 | |
| 2 | 0 | 23.9182042 | | 1 | 62.628 | |
| 3 | 199.53773 | 14.7613559 | CaF2 | 1.5584098 | 70.532 | |
| 4 | 443.737791 | 67 | | 1 | 70.487 | Aspherical surface |
| 5 | 0 | 62.4014594 | CaF2 | 1.5584098 | 75.634 | |
| 6 | 0 | −62.4014594 | CaF2 | −1.5584098 | 89.352 | BSC reflecting surface |
| 7 | 0 | −343.592135 | | −1 | 82.409 | |
| 8 | 316.106238 | −11.2495751 | CaF2 | −1.5584098 | 110.381 | |
| 9 | 7442.25424 | −29.5389704 | | −1 | 117.45 | |
| 10 | 263.732452 | −12.4062728 | CaF2 | −1.5584098 | 118.379 | |
| 11 | 868.481615 | −29.7271563 | | −1 | 130.504 | Aspherical surface |
| 12 | 257.440457 | 29.7271563 | | 1 | 133.138 | Concave mirror |
| 13 | 868.481615 | 12.4062728 | CaF2 | 1.5584098 | 130.141 | Aspherical surface |
| 14 | 263.732452 | 29.5389704 | | 1 | 116.96 | |
| 15 | 7442.25424 | 11.2495751 | CaF2 | 1.5584098 | 115.532 | |
| 16 | 316.106238 | 343.592135 | | 1 | 107.189 | |
| 17 | 0 | 62.4014594 | CaF2 | 1.5584098 | 69.745 | |
| 18 | 0 | 48.3389459 | CaF2 | 1.5584098 | 65.302 | BSC entry surface |
| 19 | 0 | 27.8212813 | | 1 | 61.883 | |
| 20 | 0 | −36.8195842 | | −1 | 60.166 | Deflecting mirror |
| 21 | 2244.00361 | −11.9622074 | CaF2 | −1.5584098 | 54.883 | |
| 22 | 323.699837 | −24.2334625 | | −1 | 54.399 | |
| 23 | 0 | −15 | | −1 | 55.994 | |
| 24 | 0 | −206.21224 | | −1 | 59.527 | |
| 25 | −1160.91962 | −33.7014498 | CaF2 | −1.5584098 | 109.711 | |
| 26 | 300.594054 | −1 | | −1 | 110.561 | |
| 27 | −219.885206 | −36.8104663 | CaF2 | −1.5584098 | 108.528 | |
| 28 | 7994.35656 | −56.4609011 | | −1 | 106.881 | |
| 29 | 381.114895 | −10 | CaF2 | −1.5584098 | 89.858 | |
| 30 | −333.173618 | −1 | | −1 | 85.726 | Aspherical surface |
| 31 | −178.904178 | −10 | CaF2 | −1.5584098 | 85.276 | |
| 32 | −122.043438 | −163.650668 | | −1 | 81.157 | |
| 33 | −313.643263 | −10 | CaF2 | −1.5584098 | 104.411 | Aspherical surface |
| 34 | −353.057551 | −15.3454138 | | −1 | 104.087 | |
| 35 | −3818.53291 | −27.7550033 | CaF2 | −1.5584098 | 104.197 | |
| 36 | 294.000625 | −1 | | −1 | 104.59 | |
| 37 | −195.839742 | −10 | CaF2 | −1.5584098 | 98.527 | |
| 38 | −120.571402 | −27.450978 | | −1 | 91.371 | |
| 39 | −166.243416 | −25.6638894 | CaF2 | −1.5584098 | 93.968 | |
| 40 | −419.897331 | −1 | | −1 | 93.021 | |
| 41 | −164.509546 | −26.839102 | CaF2 | −1.5584098 | 92.762 | |
| 42 | −511.73869 | −6.37790161 | | −1 | 91.276 | |
| 43 | 0 | −6.57762033 | | −1 | 89.9 | Aperture stop |
| 44 | 6713.18337 | −13.2328396 | CaF2 | −1.5584098 | 90.667 | Aspherical surface |
| 45 | −166.548553 | −35.8956742 | | −1 | 86.695 | |
| 46 | −2733.51846 | −23.0995075 | CaF2 | −1.5584098 | 90.17 | |
| 47 | 292.750519 | −1 | | −1 | 91.258 | |
| 48 | −122.412324 | −51.6650342 | CaF2 | −1.5584098 | 94.967 | |
| 49 | −4516.08116 | −3.05819652 | | −1 | 92.398 | Aspherical surface |
| 50 | −100.913352 | −47.5106798 | CaF2 | −1.5584098 | 73.192 | |
| 51 | −279.584872 | −1 | | −1 | 55.19 | Aspherical surface |
| 52 | −183.616913 | −30.6871732 | CaF2 | −1.5584098 | 54.793 | |
| 53 | 964.119118 | −2.8410917 | | −1 | 41.214 | Aspherical surface |
| 54 | 0 | −10 | CaF2 | −1.5584098 | 35.436 | |
| 55 | 0 | −9.76056889 | | −1 | 28.942 | |
| 56 | 0 | 0 | | −1 | 13.288 | Wafer |

TABLE 14

Asphericity Constants

Surface No. 4

| K | −8.26740000E+00 |
|---|---|
| C1 | 9.69547396E−09 |
| C2 | 3.85084728E−13 |
| C3 | 9.55285510E−18 |
| C4 | −6.58796063E−23 |
| C5 | 2.79275677E−26 |
| C6 | 0.00000000E+00 |
| C7 | 0.00000000E+00 |

TABLE 14-continued

Asphericity Constants

| C8 | 0.00000000E+00 |
|---|---|
| C9 | 0.00000000E+00 |

Surface No. 11

| K | −3.75400000E−01 |
|---|---|
| C1 | 8.42845132E−09 |
| C2 | −7.50515690E−14 |
| C3 | 2.22413384E−18 |
| C4 | −3.53515885E−23 |
| C5 | 7.39923488E−28 |

TABLE 14-continued

Asphericity Constants

| | |
|---|---|
| C6 | 0.00000000E+00 |
| C7 | 0.00000000E+00 |
| C8 | 0.00000000E+00 |
| C9 | 0.00000000E+00 |

Surface No. 13

| | |
|---|---|
| K | −3.75400000E−01 |
| C1 | 8.42845132E−09 |
| C2 | −7.50515690E−14 |
| C3 | 2.22413384E−18 |
| C4 | −3.53515885E−23 |
| C5 | 7.39923488E−28 |
| C6 | 0.00000000E+00 |
| C7 | 0.00000000E+00 |
| C8 | 0.00000000E+00 |
| C9 | 0.00000000E+00 |

Surface No. 30

| | |
|---|---|
| K | 5.60100000E−01 |
| C1 | −1.14959532E−08 |
| C2 | 3.08629311E−13 |
| C3 | 2.07236702E−17 |
| C4 | 5.86650660E−22 |
| C5 | 6.13607080E−26 |
| C6 | 0.00000000E+00 |
| C7 | 0.00000000E+00 |
| C8 | 0.00000000E+00 |
| C9 | 0.00000000E+00 |

Surface No. 33

| | |
|---|---|
| K | 2.86800000E−01 |
| C1 | 6.67207953E−11 |
| C2 | −4.97803750E−13 |
| C3 | 4.80489318E−19 |
| C4 | −1.38204305E−22 |
| C5 | 1.94531348E−26 |
| C6 | 0.00000000E+00 |
| C7 | 0.00000000E+00 |
| C8 | 0.00000000E+00 |
| C9 | 0.00000000E+00 |

Surface No. 44

| | |
|---|---|
| K | 2.09154390E+03 |
| C1 | 3.13012283E−08 |
| C2 | −5.72008907E−13 |
| C3 | −1.31108280E−17 |
| C4 | −8.09547547E−22 |
| C5 | 8.52323430E−26 |
| C6 | 0.00000000E+00 |
| C7 | 0.00000000E+00 |
| C8 | 0.00000000E+00 |
| C9 | 0.00000000E+00 |

Surface No. 49

| | |
|---|---|
| K | −5.83970000E+00 |
| C1 | 1.10477666E−08 |
| C2 | 2.52775507E−13 |
| C3 | −1.68731533E−16 |
| C4 | −1.19380083E−21 |
| C5 | 3.87096991E−25 |
| C6 | 0.00000000E+00 |
| C7 | 0.00000000E+00 |
| C8 | 0.00000000E+00 |
| C9 | 0.00000000E+00 |

Surface No. 51

| | |
|---|---|
| K | 3.43770000E+00 |
| C1 | −2.63399373E−07 |
| C2 | −8.30418097E−12 |
| C3 | −4.51222485E−15 |
| C4 | 9.13574688E−21 |
| C5 | −1.71880756E−22 |
| C6 | 0.00000000E+00 |
| C7 | 0.00000000E+00 |
| C8 | 0.00000000E+00 |
| C9 | 0.00000000E+00 |

Surface No. 53

| | |
|---|---|
| K | 1.01721000E+02 |
| C1 | −3.76207378E−08 |
| C2 | −3.45079172E−11 |
| C3 | 2.07300870E−14 |
| C4 | −7.25288582E−18 |
| C5 | 6.53768580E−22 |
| C6 | 0.00000000E+00 |
| C7 | 0.00000000E+00 |
| C8 | 0.00000000E+00 |
| C9 | 0.00000000E+00 |

TABLE 15

| SURFACE NO. | RADIUS [mm] | THICKNESS [mm] | SUBSTRATE MATERIAL | REFRACTIVE INDEX AT 157.63 nm | ONE-HALF CLEAR DIAMETER | |
|---|---|---|---|---|---|---|
| 0 | 0.000000000 | 38.000000000 | | 1.00000000 | 53.151 | |
| 1 | 0.000000000 | 25.770399770 | CaF2 | 1.55840980 | 57.879 | |
| 2 | 0.000000000 | 95.000000000 | | 1.00000000 | 59.941 | |
| 3 | 0.000000000 | 62.401459438 | CaF2 | 1.55840980 | 71.965 | |
| 4 | 0.000000000 | −62.401459438 | CaF2 | −1.55840980 | 86.154 | REFL |
| 5 | 0.000000000 | −277.653609040 | | −1.00000000 | 82.164 | |
| 6 | 274.422607159 | −10.374526603 | CaF2 | −1.55840980 | 114.835 | |
| 7 | −7120.410713240 | −31.157501852 | | −1.00000000 | 123.781 | |
| 8 | 303.227850569 | −11.345380167 | CaF2 | −1.55840980 | 125.052 | |
| 9 | 706.350349038AS | −30.380277518 | | −1.00000000 | 134.636 | |
| 10 | 257.751704334 | 30.380277518 | | 1.00000000 | 137.836 | REFL |
| 11 | 706.350349038AS | 11.345380167 | CaF2 | 1.55840980 | 133.318 | |
| 12 | 303.227850569 | 31.157501852 | | 1.00000000 | 121.320 | |
| 13 | −7120.410713240 | 10.374526603 | CaF2 | 1.55840980 | 118.195 | |
| 14 | 274.422607159 | 277.653609040 | | 1.00000000 | 108.193 | |
| 15 | 0.000000000 | 62.401459438 | CaF2 | 1.55840980 | 77.630 | |
| 16 | 0.000000000 | 48.338945864 | CaF2 | 1.55840980 | 73.276 | |
| 17 | 0.000000000 | 59.448479264 | | 1.00000000 | 69.919 | |
| 18 | 0.000000000 | −55.200769977 | | −1.00000000 | 65.943 | REFL |

TABLE 15-continued

| SURFACE NO. | RADIUS [mm] | THICKNESS [mm] | SUBSTRATE MATERIAL | REFRACTIVE INDEX AT 157.63 nm | ONE-HALF CLEAR DIAMETER |
|---|---|---|---|---|---|
| 19 | −283.433470376AS | −11.860469347 | CaF2 | −1.55840980 | 57.008 |
| 20 | −1670.599522670 | −27.564885685 | | −1.00000000 | 56.024 |
| 21 | 0.000000000 | −206.978983107 | | −1.00000000 | 50.718 |
| 22 | −2479.531238190 | −23.712853633 | CaF2 | −1.55840980 | 101.865 |
| 23 | 369.672744542 | −1.000054538 | | −1.00000000 | 102.865 |
| 24 | −227.791299599 | −36.323439556 | CaF2 | −1.55840980 | 105.443 |
| 25 | 1531.480316160 | −57.264623031 | | −1.00000000 | 104.452 |
| 26 | 314.284119650 | −34.456179308 | CaF2 | −1.55840980 | 91.668 |
| 27 | −460.318853071AS | −5.331266307 | | −1.00000000 | 88.736 |
| 28 | −250.923201197 | −16.798752893 | CaF2 | −1.55840980 | 88.891 |
| 29 | −156.543751567 | −159.068111991 | | −1.00000000 | 85.606 |
| 30 | −487.327425012AS | −32.027198850 | CaF2 | −1.55840980 | 111.309 |
| 31 | 532.470639986 | −1.046042775 | | −1.00000000 | 111.408 |
| 32 | −205.185677428 | −12.446574571 | CaF2 | −1.55840980 | 107.231 |
| 33 | −131.559247289 | −18.759001443 | | −1.00000000 | 99.664 |
| 34 | −183.966108968 | −44.650988101 | CaF2 | −1.55840980 | 100.233 |
| 35 | −409.289925792 | −4.004967441 | | −1.00000000 | 97.312 |
| 36 | −162.065225102 | −34.364069810 | CaF2 | −1.55840980 | 96.472 |
| 37 | −953.872249102 | −11.350251547 | | −1.00000000 | 94.511 |
| 38 | 0.000000000 | −8.282105151 | | −1.00000000 | 90.344 |
| 39 | 4859.629909330AS | −20.590059317 | CaF2 | −1.55840980 | 91.182 |
| 40 | −144.022662025 | −14.912769560 | | −1.00000000 | 84.621 |
| 41 | −269.007514371 | −21.393637707 | CaF2 | −1.55840980 | 84.891 |
| 42 | 8005.915833540 | −1.000553720 | | −1.00000000 | 85.015 |
| 43 | −121.422823057 | −53.925900289 | CaF2 | −1.55840980 | 86.341 |
| 44 | −39316.034640000AS | −5.683954111 | | −1.00000000 | 81.357 |
| 45 | −103.382446255 | −47.241295627 | CaF2 | −1.55840980 | 67.411 |
| 46 | −261.056770387AS | −1.087339301 | | −1.00000000 | 50.126 |
| 47 | −118.177803590 | −30.082843619 | CaF2 | −1.55840980 | 47.557 |
| 48 | 902.459194693AS | −2.295750334 | | −1.00000000 | 36.102 |
| 49 | 0.000000000 | −10.000000000 | CaF2 | −1.55840980 | 31.842 |
| 50 | 0.000000000 | −8.742536525 | | −1.00000000 | 25.681 |
| 51 | 0.000000000 | 0.000000000 | | −1.00000000 | 13.294 |

TABLE 16

| SURFACE NO. 9 | |
|---|---|
| K | 0.0000 |
| C1 | 8.78986096e−009 |
| C2 | −5.39258043e−014 |
| C3 | 2.85696988e−018 |
| C4 | −3.88571732e−023 |
| C5 | 2.01110734e−027 |
| C6 | 0.00000000e+000 |
| C7 | 0.00000000e+000 |
| C8 | 0.00000000e+000 |
| C9 | 0.00000000e+000 |

| SURFACE NO. 11 | |
|---|---|
| K | 0.0000 |
| C1 | 8.78986096e−009 |
| C2 | −5.39258043e−014 |
| C3 | 2.85696988e−018 |
| C4 | −3.88571732e−023 |
| C5 | 2.01110734e−027 |
| C6 | 0.00000000e+000 |
| C7 | 0.00000000e+000 |
| C8 | 0.00000000e+000 |
| C9 | 0.00000000e+000 |

| SURFACE NO. 19 | |
|---|---|
| K | 0.0000 |
| C1 | 5.64978656e−009 |
| C2 | 1.41743108e−013 |
| C3 | 4.11416835e−018 |
| C4 | 1.87598303e−021 |
| C5 | −1.98309360e−025 |
| C6 | 0.00000000e+000 |

TABLE 16-continued

| C7 | 0.00000000e+000 |
|---|---|
| C8 | 0.00000000e+000 |
| C9 | 0.00000000e+000 |

| SURFACE NO. 27 | |
|---|---|
| K | 0.0000 |
| C1 | −5.54094807e−011 |
| C2 | 6.57466109e−013 |
| C3 | 2.43229757e−017 |
| C4 | 9.27361276e−022 |
| C5 | −8.04676260e−026 |
| C6 | 0.00000000e+000 |
| C7 | 0.00000000e+000 |
| C8 | 0.00000000e+000 |
| C9 | 0.00000000e+000 |

| SURFACE NO. 30 | |
|---|---|
| K | 0.0000 |
| C1 | −5.19770966e−009 |
| C2 | −2.23374710e−013 |
| C3 | 9.61822601e−018 |
| C4 | 2.18176410e−022 |
| C5 | 1.39192939e−026 |
| C6 | 0.00000000e+000 |
| C7 | 0.00000000e+000 |

TABLE 17

| SURFACE NO. | RADIUS [mm] | THICKNESS [mm] | SUBSTRATE MATERIAL | REFRACTIVE INDEX AT 157.63 nm | ONE-HALF CLEAR DIAMETER | |
|---|---|---|---|---|---|---|
| 0 | 0.000000000 | 38.000000000 | | 1.00000000 | 53.852 | |
| 1 | 0.000000000 | 0.000000000 | | 1.00000000 | 61.869 | |
| 2 | 0.000000000 | 10.000000000 | CAF2HL | 1.55840983 | 61.869 | |
| 3 | 0.000000000 | 95.000000000 | | 1.00000000 | 63.210 | |
| 4 | 0.000000000 | 70.000000000 | CAF2HL | 1.55840983 | 83.482 | |
| 5 | 0.000000000 | −72.000000000 | CAF2HL | 1.55840983 | 102.602 | REFL |
| 6 | 0.000000000 | −1.300000000 | | 1.00000000 | 102.802 | |
| 7 | −488.104416260 | −30.050000000 | CAF2HL | 1.55840983 | 105.572 | |
| 8 | 801.633259225 | −471.735414324 | | 1.00000000 | 106.178 | |
| 9 | 436.399395451 | −15.000000000 | CAF2HL | 1.55840983 | 110.710 | |
| 10 | −2434.816805380AS | −50.943835699 | | 1.00000000 | 113.860 | |
| 11 | 178.866365443 | −15.000000000 | CAF2HL | 1.55840983 | 115.089 | |
| 12 | 464.496312090 | −21.012439653 | | 1.00000000 | 131.554 | |
| 13 | 275.601125347 | 21.012439653 | | 1.00000000 | 134.819 | REFL |
| 14 | 464.496312090 | 15.000000000 | CAF2HL | 1.55840983 | 132.513 | |
| 15 | 178.866365443 | 50.943835699 | | 1.00000000 | 116.992 | |
| 16 | −2434.816805380AS | 15.000000000 | CAF2HL | 1.55840983 | 116.079 | |
| 17 | 436.399395451 | 471.735414324 | | 1.00000000 | 112.934 | |
| 18 | 801.633259225 | 30.050000000 | CAF2HL | 1.55840983 | 111.432 | |
| 19 | −488.104416260 | 1.300000000 | | 1.00000000 | 110.945 | |
| 20 | 0.000000000 | 125.000000000 | CAF2HL | 1.55840983 | 107.842 | |
| 21 | 0.000000000 | 52.000000000 | | 1.00000000 | 90.448 | |
| 22 | 0.000000000 | −70.000000000 | | 1.00000000 | 89.074 | REFL |
| 23 | −427.846696583AS | −13.914021393 | CAF2HL | 1.55840983 | 62.804 | |
| 24 | 7249.543725070 | −10.000000006 | | 1.00000000 | 61.074 | |
| 25 | 0.000000000 | −124.531705213 | | 1.00000000 | 57.898 | |
| 26 | 188.294011329 | −10.050000000 | CAF2HL | 1.55840983 | 63.937 | |
| 27 | −448.900864960 | −64.580019893 | | 1.00000000 | 69.804 | |
| 28 | −4743.075427040 | −28.116269532 | CAF2HL | 1.55840983 | 98.717 | |
| 29 | 298.689021823 | −1.300000000 | | 1.00000000 | 101.346 | |
| 30 | −919.034947465AS | −37.601624221 | CAF2HL | 1.55840983 | 107.092 | |
| 31 | 267.622393967 | −260.525268950 | | 1.00000000 | 108.238 | |
| 32 | 755.277558968AS | −10.050000000 | CAF2HL | 1.55840983 | 92.697 | |
| 33 | −179.040084221 | −19.322453112 | | 1.00000000 | 92.804 | |
| 34 | −296.257800023 | −35.298403549 | CAF2HL | 1.55840983 | 96.928 | |
| 35 | 498.527196124 | −8.974059777 | | 1.00000000 | 97.967 | |
| 36 | −274.199774099AS | −11.887013970 | CAF2HL | 1.55840983 | 100.273 | |
| 37 | −169.083655862 | −30.533101962 | | 1.00000000 | 98.161 | |
| 38 | −223.429669944 | −46.333114352 | CAF2HL | 1.55840983 | 106.354 | |
| 39 | 557.517932602 | 6.023651086 | | 1.00000000 | 106.204 | |
| 40 | 0.000000000 | −7.323651086 | | 1.00000000 | 105.665 | |
| 41 | −180.272170909 | −39.940002425 | CAF2HL | 1.55840983 | 106.132 | |
| 42 | −1089.157612150 | −10.304626549 | | 1.00000000 | 103.662 | |
| 43 | −3831.795047550AS | −11.862731666 | CAF2HL | 1.55840983 | 102.011 | |
| 44 | −136.004789290 | −19.743546725 | | 1.00000000 | 92.709 | |
| 45 | −211.907674146 | −46.611908541 | CAF2HL | 1.55840983 | 93.916 | |
| 46 | 304.068165518 | −1.300000000 | | 1.00000000 | 93.520 | |
| 47 | −113.450260037 | −42.182471107 | CAF2HL | 1.55840983 | 80.567 | |
| 48 | −442.656876818 | −1.300000000 | | 1.00000000 | 73.333 | |
| 49 | −153.684144531 | −24.346083749 | CAF2HL | 1.55840983 | 66.004 | |
| 50 | −576.856700079 | −5.226009960 | | 1.00000000 | 58.202 | |
| 51 | −429.648740736AS | −31.897563520 | CAF2HL | 1.55840983 | 52.244 | |
| 52 | 1071.884526360 | −1.068000000 | | 1.00000000 | 34.496 | |
| 53 | 0.000000000 | −8.900000000 | CAF2HL | 1.55840983 | 31.892 | |
| 54 | 0.000000000 | −7.999928930 | | 1.00000000 | 26.143 | |
| 55 | 0.000000000 | −0.000071070 | | 1.00000000 | 13.463 | |

TABLE 18

| | SURFACE NO. 10 |
|---|---|
| K | 0.0000 |
| C1 | 5.46327776e−009 |
| C2 | −1.30765283e−013 |
| C3 | 1.13332382e−019 |
| C4 | −5.00256292e−023 |
| C5 | −2.65077311e−027 |
| | SURFACE NO. 16 |
| K | 0.0000 |
| C1 | 5.46327776e−009 |

TABLE 18-continued

| | |
|---|---|
| C2 | −1.30765283e−013 |
| C3 | 1.13332382e−019 |
| C4 | −5.00256292e−023 |
| C5 | −2.65077311e−027 |
| | SURFACE NO. 23 |
| K | 0.0000 |
| C1 | 5.05252484e−009 |
| C2 | 1.15142312e−014 |
| C3 | 2.50216778e−018 |
| C4 | −1.96103230e−022 |
| C5 | 5.12365014e−026 |

TABLE 18-continued

| | SURFACE NO. 30 | |
|---|---|---|
| K | 0.0000 | |
| C1 | 8.39108946e−009 | |
| C2 | −1.68189505e−014 | |
| C3 | −6.43811475e−019 | |
| C4 | −1.00430995e−023 | |
| C5 | 5.30010920e−028 | |
| | SURFACE NO. 32 | |
| K | 0.0000 | |
| C1 | 2.23694733e−009 | |
| C2 | −1.12111800e−012 | |
| C3 | 4.82955102e−017 | |
| C4 | −8.78536507e−022 | |
| C5 | 2.21694481e−026 | |
| | SURFACE NO. 36 | |
| K | 0.0000 | |
| C1 | 1.28171825e−008 | |
| C2 | 3.67590616e−013 | |
| C3 | −2.33985769e−017 | |
| C4 | −2.02129247e−022 | |
| C5 | −3.59444322e−026 | |
| | SURFACE NO. 43 | |
| K | 0.0000 | |
| C1 | 2.72386542e−008 | |
| C2 | −2.06072032e−012 | |
| C3 | 1.12756270e−016 | |
| C4 | −3.57576742e−021 | |
| C5 | 8.75972852e−026 | |
| | SURFACE NO. 51 | |
| K | 0.0000 | |
| C1 | 5.29485036e−008 | |
| C2 | 2.55632939e−012 | |
| C3 | −7.84971549e−016 | |
| C4 | 8.73094078e−020 | |
| C5 | 3.83247032e−024 | |

What is claimed is:

1. A catadioptric projection lens for imaging a pattern situated in an object plane onto an image plane, comprising:
an optical axis;
a first catadioptric lens section having a concave mirror and a physical beamsplitter having a beamsplitting surface; and
a second lens section arranged following the beamsplitter;
the first and second lens sections being arranged between the object plane and the image plane; wherein
the object plane is arranged at a working distance from a first optical surface of the projection lens;
positive refractive power is arranged in an optical near-field of the object plane where a marginal-ray height is less than about 30% of a marginal-ray height at the concave mirror; and
the beamsplitter is arranged in a zone having low marginal ray height where a projection of marginal-ray heights onto a plane orthogonal to the optical axis at an intersection of the beam splitting surface with the optical axis is within a range from 10% to 70% of the marginal-ray height at the concave mirror.

2. A projection lens according to claim 1 that is designed to create at least one real intermediate image.

3. A projection lens according to claim 2, wherein the intermediate image is freely accessible.

4. A projection lens according to claim 2, wherein the beamsplitter is arranged in a vicinity of the intermediate image.

5. A projection lens according to claim 2, wherein at least one lens of the second lens section is arranged between the beamsplitting surface and the intermediate image.

6. A projection lens according to claim 5, wherein positive refractive power is arranged between the beamsplitting surface and the intermediate image.

7. A projection lens according to claim 2, wherein the beamsplitter is arranged in a vicinity of the intermediate image.

8. A projection lens according to claim 2, wherein a maximum extension of the beamsplitter transverse to the optical axis is less than 70% of the diameter of the concave mirror.

9. A projection lens according to claim 2, wherein no free-standing lens is arranged in a zone between the object plane and the beamsplitter.

10. A projection lens according to claim 2, wherein an intermediate image is arranged optically downstream from light reflected by the beamsplitter, and is arranged at a distance from the beamsplitter, and wherein positive refractive power is arranged between the beamsplitter and intermediate image.

11. A projection lens according to claim 2, wherein the beamsplitting surface is arranged at an inclination angle with respect to a segment of the optical axis orthogonal to the object plane that differs from 45°.

12. A projection lens according to claim 11, wherein a difference between the inclination angle and 45° is within a range from about 1° to about 10°.

13. A projection lens according to claim 1, that is designed to create at least one real intermediate image and wherein positive refractive power is arranged in an optical near-field of the intermediate image where a marginal-ray height is less than about 30% of a marginal-ray height at the concave mirror.

14. A projection lens according to claim 1, that is designed to create at least one real intermediate image and wherein the positive refractive power arranged in an optical near-field of the object plane is arranged in an optical near-field of the intermediate image where a marginal-ray height is less than about 30% of a marginal-ray height at the concave mirror.

15. A projection lens according to claim 1, wherein the beamsplitter is arranged in a zone having a first direction of propagation of radiation from the object plane to the concave mirror and a second direction of propagation of radiation from the concave mirror to the image plane, and wherein, in that zone, the marginal-ray heights for both directions of propagation are less than about 70% of the marginal-ray height at the concave mirror.

16. A projection lens according claim 1, wherein the beamsplitter is a beamsplitter block having a shape deviating from the shape of a cube.

17. A projection lens according claim 1, wherein the beamsplitter is a beamsplitter block having a shape having dimensions that are optimized such that the volume of the beam splitter block is minimized.

18. A projection lens according to claim 1, wherein a maximum extension of the beamsplitter transverse to the optical axis is less than 70% of the diameter of the concave mirror.

19. A projection lens according to claim 1, wherein a positive refractive power is arranged between the object plane and the beamsplitter.

20. A projection lens according to claim 1, wherein a zone between the object plane and beamsplitter is essentially free of positive refractive power.

21. A projection lens according to claim 1, wherein no free-standing lens is arranged in a zone between the object plane and the beamsplitter.

22. A projection lens according to claim 1, wherein positive refractive power is arranged optically following the beamsplitter, within the optical near-field of the object plane.

23. A projection lens according to claim 2, wherein positive refractive power is arranged optically following the beamsplitter, within the optical near-field of the intermediate image.

24. A projection lens according to claim 1, wherein an intermediate image is arranged optically downstream from light reflected by the beamsplitter, and is arranged at a distance from the beamsplitter, and wherein positive refractive power is arranged between the beamsplitter and intermediate image.

25. A projection lens according to claim 1, wherein, at the beamsplitter, angles between marginal rays and the optical axis in air are less than 10° along at least one direction of propagation.

26. A projection lens according to claim 25, wherein, at the beamsplitter, angles between marginal rays and the optical axis in air are less than 5° along at least one direction of propagation.

27. A projection lens according to claim 1, wherein the catadioptric lens section contains exclusively lenses having negative refractive powers between the beamsplitter and the concave mirror.

28. A projection lens according to claim 1, wherein the catadioptric section contains at least two lenses having negative refractive powers between the beamsplitter and the concave mirror.

29. A projection lens according to claim 1, wherein the catadioptric section contains less than four lenses between the beamsplitter and the concave mirror.

30. A projection lens according to claim 29, wherein the catadioptric section contains less than three lenses between the beamsplitter and the concave mirror.

31. A projection lens according to claim 1, wherein a part of the catadioptric lens section between the beamsplitter and the concave mirror is overcorrected for longitudinal chromatic aberration such that at least 70% of an overcorrection of other lens components is compensated.

32. A projection lens according to claim 31, wherein the part of the catadioptric lens section between the beamsplitter and the concave mirror is overcorrected for longitudinal chromatic aberration such that more than 85% of the overcorrection of the other lens components is compensated.

33. A projection lens according to claim 1, wherein no lens having a positive refractive power is situated in an optical near-field of the concave mirror, wherein a marginal-ray height within that optical near-field is more than 70% of the marginal-ray height at the concave mirror.

34. A projection lens according to claim 1, wherein the beamsplitting surface is arranged at an inclination angle with respect to a segment of the optical axis orthogonal to the object plane that differs from 45°.

35. A projection lens according to claim 24, wherein a difference between the inclination angle and 450 is within a range from about 1° to about 10°.

36. A projection lens according to claim 34, wherein the inclination angle is set such that an included deflection angle between a segment of the optical axis orthogonal to the object plane and a segment of the optical axis that is arranged following a folding at the beamsplitting surface exceeds 90°.

37. A projection lens according to claim 34, wherein to the second lens section is allocated at least one deflecting mirror that is arranged at an inclination angle with respect to the optical axis that differs from 45°, where the inclination angle of the deflecting mirror and the inclination angle of the beamsplitting surface are adapted to one another such that the image plane is aligned one of parallel to, and orthogonal to, the object plane.

38. A projection lens according to claim 1, wherein all transparent optical components are fabricated from the same material.

39. A projection lens according to claim 1, wherein the beamsplitter consists essentially of lithium fluoride.

40. A projection lens according to claim 1 that is designed to be telecentric at least on its image end.

41. A projection lens according to claim 1 that has an image-end numerical aperture exceeding about 0.8.

42. A projection lens according to claim 1 that is designed for use with ultraviolet light at wavelengths of less than about 200 nm.

43. A projection lens according to claim 1, wherein at least one optical component has at least one aspherical surface.

44. A projection lens according to claim 43, wherein the at least one aspherical surface is provided in the vicinity of the plane for a system stop, wherein the aspherical surface is arranged such that a ratio of the marginal-ray height at that aspherical surface to a radius of an opening in the system stop ranges from about 0.8 to about 1.2.

45. A projection lens according claim 43, wherein at least one aspherical surface is provided at least one of in the vicinity of the object plane and in the vicinity of the image plane and in the vicinity of at least one intermediate image, wherein the aspherical surface is arranged such that a ratio of the marginal-ray height at the aspherical surface to the radius of an opening in a system stop is less than about 0.8.

46. A projection lens according to claim 43, wherein the at least one aspherical surface is arranged in the vicinity of the plane for a system stop and at least one aspherical surface is arranged in the vicinity of at least one of the object plane and the image plane and at least one intermediate image.

47. A projection lens according to claim 1, further comprising a system stop arranged at a distance from the beamsplitter.

48. A projection lens according to claim 1, further comprising a freely accessible stop-plane.

49. A projection lens according to claim 1, wherein at least one of a first optical element situated closest to the object plane and a final optical element situated closest to the image plane is formed from a virtually plane-parallel plate.

50. A projection lens according to claim 1, wherein at least one fully reflecting deflecting planar mirror is provided.

51. A projection lens according to claim 50, wherein a first optical component of the second section, following the beamsplitter, is a fully reflecting planar deflecting mirror.

52. A projection exposure system for use in microlithography having an illumination system and a catadioptric projection lens, wherein the projection lens is configured in accordance with claim 1.

53. A projection exposure system according to claim 52, wherein the illumination system is designed for emitting partially polarized light.

54. A method for fabricating semiconductor devices or other types of microdevices, comprising:
providing a mask having a prescribed pattern;
illuminating the mask with ultraviolet light having a prescribed wavelength; and
projecting an image of the pattern onto a photosensitive substrate arranged in the vicinity of the image plane of a projection lens using a catadioptric projection lens in accordance with claim 1.

* * * * *